United States Patent
Aberg et al.

(10) Patent No.: US 10,372,841 B2
(45) Date of Patent: Aug. 6, 2019

(54) SELF-TESTING GRAPHICAL COMPONENT ALGORITHM SPECIFICATION

(71) Applicant: The MathWorks, Inc., Natick, MA (US)

(72) Inventors: Robert O. Aberg, South Grafton, MA (US); Peter S. Szpak, Newton, MA (US); Andrew C. Grace, Sherborn, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 13/662,529

(22) Filed: Oct. 28, 2012

(65) Prior Publication Data

US 2014/0122026 A1    May 1, 2014

(51) Int. Cl.
  *G06F 17/50*    (2006.01)
(52) U.S. Cl.
  CPC ................. *G06F 17/5009* (2013.01)
(58) Field of Classification Search
  None
  See application file for complete search history.

(56) References Cited

U.S. PATENT DOCUMENTS

| 7,324,931 | B1 | 1/2008 | Warlock |
| 7,991,598 | B1 | 8/2011 | Wood |
| 2008/0028364 | A1* | 1/2008 | Triou et al. ............ 717/104 |
| 2010/0131917 | A1* | 5/2010 | Iwamasa ................. 717/104 |
| 2011/0138353 | A1* | 6/2011 | Niere et al. ............. 717/104 |
| 2012/0124552 | A1* | 5/2012 | Lin et al. ................ 717/107 |
| 2013/0074040 | A1* | 3/2013 | Peranandam et al. .... 717/124 |

FOREIGN PATENT DOCUMENTS

| JP | 09-251474 A | 9/1997 |
| JP | 2006-178775 A | 7/2006 |

(Continued)

OTHER PUBLICATIONS

Wikipedia, Atomicity (database systems). Version dated Sep. 11, 2012.*

(Continued)

*Primary Examiner* — Bijan Mapar
(74) *Attorney, Agent, or Firm* — Cesari and McKenna, LLP; Michael R. Reinemann

(57) ABSTRACT

A system and method automatically ensures consistency among a design model and one or more test models that test the design model. The system may include a broker adapted to construct an interface specification. The interface specification identifies the interface of the design model, e.g., its external inputs, external outputs, and initialization states. It may also identify the outputs, inputs, and initialization setting objects of the test models. Proposed changes to the design model's interface may be captured by the broker, and applied to the design model and to the test models atomically. Proposed changes to a given test model that implicate the design model's interface also may be captured, and applied to the given test model, the other test models, and the design model atomically. Default behaviors may be defined for applying the proposed changes to the other test models and the design model.

32 Claims, 19 Drawing Sheets

(56) References Cited

FOREIGN PATENT DOCUMENTS

| WO | WO 2008/066925 | 6/2008 |
|---|---|---|
| WO | WO-2008/066925 A2 | 6/2008 |

OTHER PUBLICATIONS

Wikipedia, Model-view-Controller. Version dated Sep. 21, 2012.*
Iyenghar, Padma, Elke Pulvermueller, and Clemens Westerkamp. "Towards model-based test automation for embedded systems using UML and UTP." Emerging Technologies & Factory Automation (ETFA), 2011 IEEE 16th Conference on. IEEE, 2011.*
Tarhini, Abbas, Hacène Fouchal, and Nashat Mansour. "Regression Testing Web Services-based Applications." AICCSA 6 (2006): 163-170.*
Han, Li, et al., "Object-Oriented Libraries of Physical Components in Simulation and Design," Institute for Complex Engineered Systems and Department of Electrical and Computer Engineering, Carnegie Mellon University, Pittsburgh, PA, May 2001, pp. 1-8.
Akour, Mohammed, et al., "Towards Change Propagating Test Models in Autonomic and Adaptive Systems," 18$^{th}$ IEEE International Conference and Workshops On, IEEE, Apr. 27, 2011, pp. 89-96.
"Invitation to Pay Additional Fees and, Where Applicable, Protest Fee," International Filing Date: Oct. 24, 2013, International Application No. PCT/US2013/066537, Applicant: The MathWorks, Inc., dated Jan. 21, 2014, pp. 1-7.
Sandmann, Guido et al., "AUTOSAR-Compliant Development Workflows: From Architecture to Implementation—Tool Interoperability for Round-Trip Engineering and Verification & Validation," SAE Technical Papers, The MathWorks, Inc., Jan. 1, 2012, pp. 1-8.
Siegl, Sebastian, et al., "Automated Testing of Embedded Automotive Systems from Requirement Specification Models," Test Workshop (LATW), 12$^{th}$ Latin American, IEEE, Mar. 27, 2011, pp. 1-6.
Erkkinen and Conrad, "Verification, Validation, and Test with Model-Based Design", Copyright 2008 The MathWorks, Inc.
S. Popinchalk, "Guy and Seth on Simulink—Bus Objects and Interface Specifications" (Apr. 18, 2008).
"Software and Processor-in-the-Loop (SIL and PIL) Simulation" (copr. 2007-2009 The MathWorks, Inc.).
Morse and Anderson, "Introducing Application Design and Software Engineering Principles in Introductors CS Courses: Model-View-Controller Java Application Framework", Copyright 2004 by the Consortium for Computing Sciences in Colleges, pp. 190-201.
Burbeck, Applications Programming in Smalltalk-80™: How to use Model-View-Controller (MVC), Copyright 1987, 1992, pp. 1-11.
Guido Sandmann et al: "AUTOSAR-compliant development workflows: From architecture to implementation-tool interoperability for round-trip engineering and verification and validation", SAE Technical Papers, Jan. 1, 2012, Retrieved from the Internet: URL:http://www.mathworks.com/tagteam/72346_SAE_2012_AUTOSAR_RoundTrip.pdf, pp. 1-8.
Sebastian Siegl et al: "Automated testing of embedded automotive systems from requirement specification models", Test Workshop (LATW), 2011 12$^{th}$ Latin American, IEEE, Mar. 27, 2011, pp. 1-6.
Mohammed Akour et al: "Towards Change Propagating Test Models in Autonomic and Adaptive Systems", Engineering of Computer Based Systems (ECBS), 2011 18$^{th}$ IEEE International Conference and Workshops on, IEEE, Apr. 27, 2011, pp. 89-96.
Notification of Transmittal of the International Search Report and the Written Opinion of the International Searching Authority, or the Declaration dated Sep. 22, 2014.
"Writing S-Functions in C," Version from Jul. 9, 2009, <https://web.archive.org/web/20090709091209/http://www-rohan.sdsu.edu/doc/matlab/toolbox/Simulink/sfg/sfunc_c12.html>.
Software and Processor-in-the-Loop (SIL and PIL) Simulation, published by The Mathworks, Inc., retrieved on Feb. 23, 2012, 8 pages.
Popinchalk, Seth et al., "Guy and Seth on Simulink: Bus Objects and Interface Specifications", published by The Mathworks, Inc., retrieved on Feb. 22, 2012, 7 pages.
Erkkinen, Tom et al., "Verification, Validation, and Test with Model-Based Design", published by The Mathworks, Inc., Apr. 2008, 6 pages.
Morse, Scot F. et al., Introducing Application Design and Software Engineering Principles in Introductory CS Courses: Model-View-Controller Java Application Framework, published by Consortium for Computing Sciences in Colleges, 2004, pp. 190-201.
Burbeck, Steve. Applications Programming in Smalltalk-80(TM): How to use Model-View-Controller (MVC), 1992, 11 pages.
"Simulink®: User's Guide: R2011b," The MathWorks, Inc., Sep. 2011, pp. 1-2116.

* cited by examiner

FIG. 4A

| Interface Specification | | 414 | 416 | 418 420 | | 456 | 458 |
|---|---|---|---|---|---|---|---|
| Design Model | | | | | | Test Model1 | Test Model2 |
| External Inputs 412 | | | | | | External Outputs 460 | External Outputs 470 |
| Name | | Data Type | Numeric Type | Data Dimension | Sampling Mode | Name | Name |
| In1 | | Single | Real | Vector | Frame | Out1 | Out1 |
| In2 | | Double | Complex | Array | Sampling | Out2 | Out2 |
| External Outputs 422 | | 424 | 426 | 428 430 | | External Inputs 462 | External Inputs 472 |
| Name | | Data Type | Numeric Type | Data Dimension | Sampling Mode | Name | Name |
| Out1 | | Single | Real | Array | Sampling | In1 | In1 |
| Out2 | | Fixed Point | Real | Vector | | In2 | In2 |
| Out3 | | Boolean | Real | Scalar | Sampling | In3 | In3 |
| Initialization States 432 | | 434 | 436 | 438 | | 464 | 474 |
| Name | | Data Type | Numeric Type | Data Dimension | | Name | Name |
| State2 | | | | | | | |
| Data Store Memory Read1 | | | | | | Data Store Memory Write1 | Data Store Memory Write1 |

400
402
404
406

SELF-TESTING GRAPHICAL COMPONENT ALGORITHM SPECIFICATION

BRIEF DESCRIPTION OF THE DRAWINGS

The invention description below refers to the accompanying drawings, of which:

FIGS. 4A-B are an illustration of an interface specification in accordance with an embodiment of the present invention;

DETAILED DESCRIPTION OF AN ILLUSTRATIVE EMBODIMENT

Overview

Figure 1:
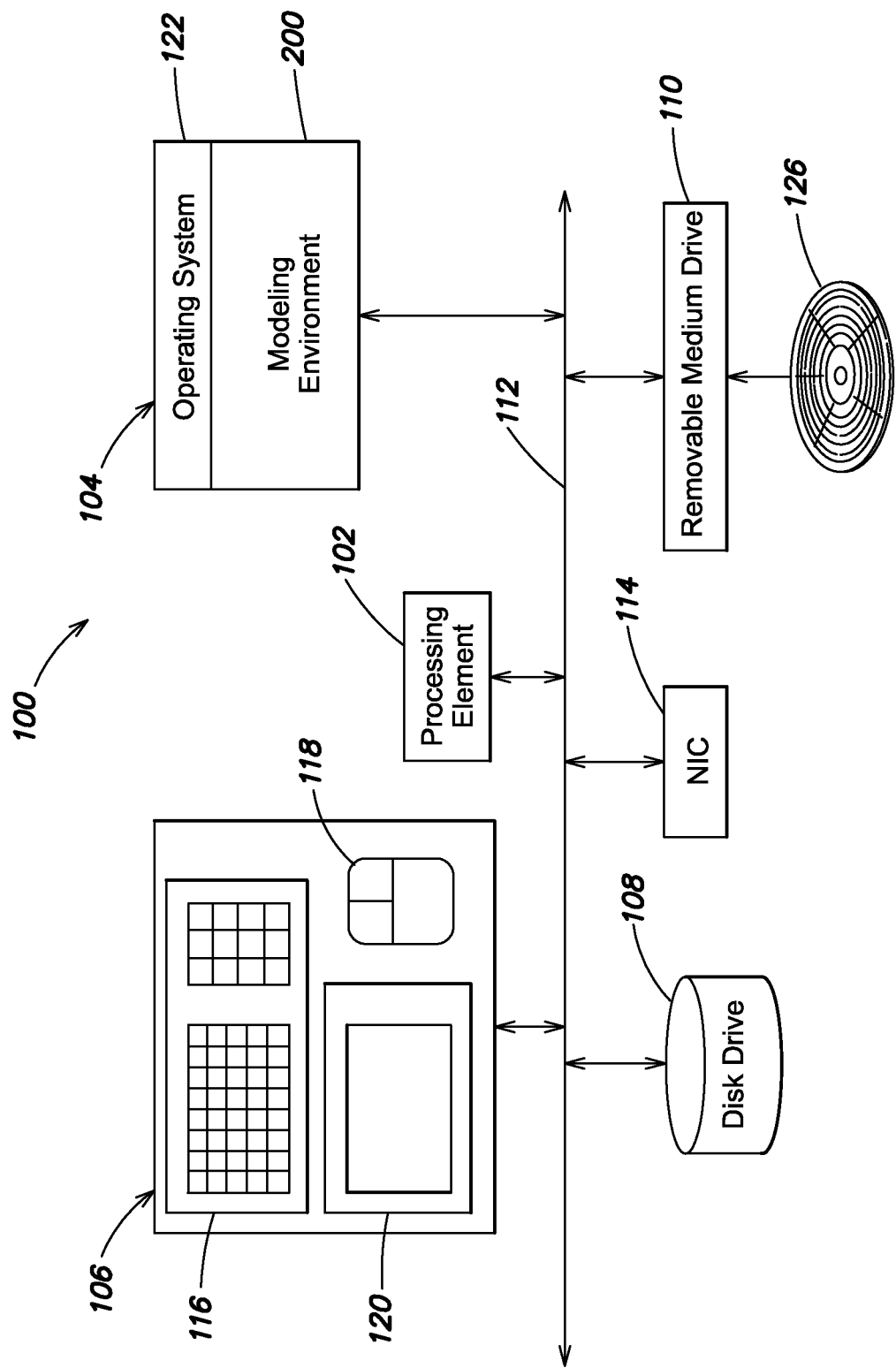
FIG. 1 is a schematic block diagram of a data processing system suitable for use with the present invention.

In an embodiment, the present invention relates to a system and method for automatically ensuring consistency among a design model and one or more test models created to test the design model. The design model may have an interface comprising one or more external inputs, one or more external outputs, one or more initialization states, and one or more parameters. During execution, the design model receives data at its inputs, processes that data based on the initialization states and parameters, computes results, and presents the computed results at its outputs. The one or more test models may include outputs and inputs that correspond to at least some of the inputs and outputs of the design model. In addition, the test models may specify data for their outputs, which are used to drive the inputs of the design model, thereby testing the design model. The test models may also specify data logging or test criteria, such as pass/fail criteria, for their inputs, which are driven by the outputs of the design model. The test models also may include one or more initialization and parameter setting objects for specifying values for the design model's initialization states and parameters during each test run of the design model. During testing, the design model may be referred to as a device under test (DUT).

The system of the present invention may include a broker adapted to construct an interface specification for the design model. The interface specification identifies the external inputs, external outputs, initialization states, and parameters of the design model, and the outputs, inputs, initialization setting objects, and parameter setting objects of the test models. Proposed changes to the design model's interface, for example through user-initiated edits, are captured by the broker. The broker examines the interface specification and, based on the proposed change, determines one or more corresponding changes to the test models to maintain consistency. The proposed change to the interface is carried out, and the determined changes to the test models are automatically applied so that the test models remain consistent with the changed design model. Changes to the design model that do not alter its interface may be ignored by the broker, and may thus cause no corresponding changes to the test models.

The broker may also capture proposed changes to the test models to the extent they affect the interface specification. The broker examines the interface specification and, based on the proposed change to a first test model, determines corresponding changes to the interface of the design model and to the other test models. The proposed change to the test model is carried out, and the broker automatically applies the determined changes to the design model and to the other test models to maintain consistency among the test models and the design model.

The proposed and determined changes to the design model and the test models may be performed as part of an atomic transaction. That is, the changes are made either to both the design model and the test models to completion, or to neither the design model nor the test models. The changes to both the design model and the test models may be implemented as one transaction, e.g., as a single logical function.

In an embodiment, a single interface may be created, and the design model and the test model may be configured to point to this single interface, which may be referred to as a mirror diagram. That is, the design model and the test model may point to the same interface, e.g., the one mirror diagram. Changes, such as user edits, made to the interface of the design model or to the interface of the test model are applied to the single interface created for both the design model and the test model. Thus, rather than the design model and the test model having their own separate interfaces, a single interface is created for both the design model and the test model. In this embodiment, the atomic and/or automatic modifying of both the design model and the test model may be avoided.

Data Processing System

FIG. 1 is a schematic illustration of a computer or data processing system 100 for implementing and utilizing an embodiment of the invention. The computer system 100 includes one or more processing elements, such as a processing element 102, a main memory 104, user input/output (I/O) 106, a data storage unit, such as a disk drive 108, and a removable medium drive 110 that are interconnected by a system bus 112. The computer system 100 may also include a communication unit, such as a network interface card (NIC) 114. The user I/O 106 may include a keyboard 116, a pointing device, such as a mouse 118, and a display 120. Other user I/O 106 components include voice or speech command systems. Other pointing devices include touchpads and touchscreens, and other output devices include printers, projectors, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 104 may store a plurality of program libraries or modules, such as an operating system 122, and one or more application programs that interface to the operating system 122, including a modeling environment application 200.

The removable medium drive 110 may accept and read a computer readable medium 126, such as a CD, DVD, floppy disk, solid state drive, tape, flash memory or other medium. The removable medium drive 110 may also write to the computer readable medium 126.

Suitable computer systems include personal computers (PCs), workstations, laptops, tablets, palm computers, smart phones, electronic readers, and other portable computing devices, etc. Nonetheless, the computer system 100 of FIG. 1 is intended for illustrative purposes only, and the present invention may be used with other computer systems, data processing systems, or computational devices. The present invention may also be used in a networked, e.g., client-server, computer architecture, or a public and/or private cloud computing arrangement. For example, the modeling environment application 200 may be hosted on a server, and accessed by a remote client through an application hosting system, such as the Remote Desktop Connection tool from Microsoft Corp of Redmond, Wash.

Suitable operating systems 122 include the Windows series of operating systems from Microsoft Corp., the Linux operating system, the MAC OS® series of operating systems from Apple Inc. of Cupertino, Calif., and the UNIX® series of operating systems, among others.

As indicated above, a user or developer, such as an engineer, scientist, programmer, test engineer, etc., may utilize one or more input devices, such as the keyboard 116, the mouse 118, and the display 120 to operate the modeling environment 200, and construct one or more design models of a system that is being designed or evaluated, and one or more test models for testing the design models. The design models and the test models may be computational and may have executable semantics. In particular, they may be executable. The design models may provide one or more of time-based, event-based, state-based, frequency-based, control-flow based, and dataflow-based execution semantics. The execution of a design model may simulate operation of the system that is being designed or evaluated, for example a physical system.

In an embodiment, the modeling environment 200 is a high-level modeling environment. Suitable high-level modeling environments include the MATLAB® and Simulink® technical computing environments from The MathWorks, Inc. of Natick, Mass., as well as the Simscape physical modeling system and the Stateflow charting tool also from The MathWorks, Inc., the MapleSim physical modeling and simulation tool from Waterloo Maple Inc. of Waterloo, Ontario, Canada, the LabVIEW programming system and the NI MatrixX model-based design product both from National Instruments Corp. of Austin, Tex., the Visual Engineering Environment (VEE) from Agilent Technologies, Inc. of Santa Clara, Calif., the System Studio model-based signal processing algorithm design and analysis tool from Synopsys, Inc. of Mountain View, Calif., the SPW signal processing algorithm tool from Synopsis, a Unified Modeling Language (UML) system, a Systems Modeling Language (SysML) system, the System Generator system from Xilinx, Inc. of San Jose, Calif., and the graphical modeling systems described in U.S. Pat. No. 7,324,931 for Conversion of Model Components Into References and U.S. Pat. No. 7,991,598 for Method and System for Modeling a Mechanical System, which are hereby incorporated by reference in their entireties, among others. Models created in the high-level modeling environment may contain less implementation detail, and thus operate at a higher level than certain programming languages, such as the C, C++, C#, and SystemC programming languages.

Those skilled in the art will understand that the MATLAB® technical computing environment is a math-oriented, textual programming environment for digital signal processing (DSP) design, among other uses. The Simulink® technical computing environment is a model-based design environment for modeling and simulating dynamic systems, among other uses. The MATLAB® and Simulink® tools provide a number of high-level features that facilitate algorithm development and exploration, and support model-based design. Exemplary high-level features include dynamic typing, array-based operations, data type inferencing, sample time inferencing, and execution order inferencing, among others.

In another embodiment, a lower level programming language, such as the C, C++, and C# programming languages, among others, may be used to create the design model and the test models instead of a high-level modeling environment.

Modeling Environment

Figure 2:
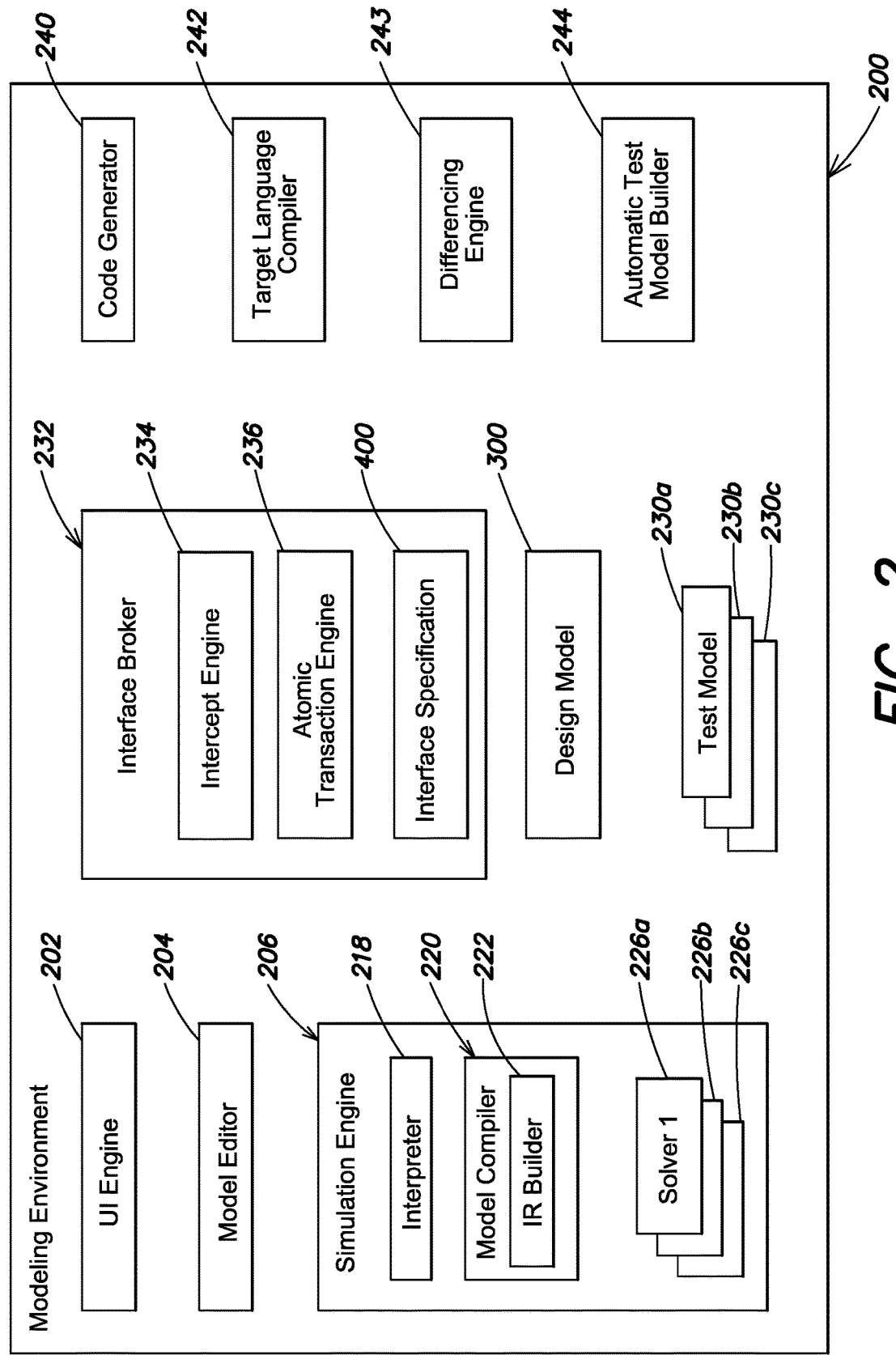
FIG. 2 is a partial functional diagram of a modeling environment in accordance with an embodiment of the present invention.

FIG. 2 is partial block diagram of an embodiment of the modeling environment 200. The environment 200 may include a user interface (UI) engine 202, a model editor 204, and a simulation engine 206. The simulation engine 206 may include an interpreter 218, a model compiler 220 that, in turn, may include one or more Intermediate Representation (IR) builders, such as IR builder 222, and one or more, and preferably a plurality, of solvers, such as solvers 226a-c. Exemplary solvers include one or more fixed-step continuous solvers, which may utilize integration techniques based on Euler's Method or Huen's Method, and one or more variable-step solvers, which may be based on the Runge-Kutta and Dormand-Prince pair. A non-exhaustive description of suitable solvers may be found in the *Simulink 7 User's Guide* from The MathWorks, Inc. (September 2011 ed.), which is hereby incorporated by reference in its entirety.

The model editor 204 may be used to construct one or more design models, such as design model 300. The model editor 204 also may be used to construct one or more test models 230a-c for testing the design model 300.

In an embodiment, an interface broker 232 may be integrated in the modeling environment 200. The interface broker 232, which also may be referred to as a broker 232, may include an intercept engine 234, and an atomic transaction engine 236. The broker 232 may further include or have access to one or more interface specifications, such as interface specifications 400. In an embodiment, the broker 232 may construct and maintain at least one interface specification 400 for each design model, such as design model 300.

The modeling environment 200 may include other components, such as a code generator 240, a target language compiler 242, a differencing engine 243, and an automatic test model builder 244. The code generator 240 may be configured to generate computer programming code, such as source and/or object code, from a model. The target language compiler 242 may be configured to compile source code, such as source code generated by the code generator 240, for execution by a target platform or target hardware. The differencing engine 243 may be configured to analyze two models, and generate a report that describes the differences between the two models. The automatic test model builder 244 may be configured to construct a test model for a design model automatically. Suitable code generators for use with the present invention include, but are not limited to, the Simulink Coder, the Embedded Coder, and the Simulink HDL Coder products from The MathWorks, Inc., and the TargetLink product from dSpace GmbH of Paderborn Germany. However, other code generation systems may be used.

The broker 232 and the automatic test model builder 244 as well as other components of the modeling environment 200 may each comprise registers and combinational logic configured and arranged to produce sequential logic circuits. In an embodiment, the broker 232 and the automatic test model builder 244 may be implemented through one or more software modules or libraries containing program instructions pertaining to the methods described herein. The software modules may be stored on main memory 104 and/or computer readable media, such as computer readable medium 126, and executable by one or more processing elements, such as processing element 102. Other computer readable media may also be used to store and execute these program instructions. In alternative embodiments, various combinations of software and hardware, including firmware, may be utilized to implement the present invention.

The interface specification 400, the design model 300, and the test models 230 may be implemented through files, tables, trees, or other data structures or objects. They may be stored on main memory 104, persistent memory 108, and/or medium 126.

Figure 3:
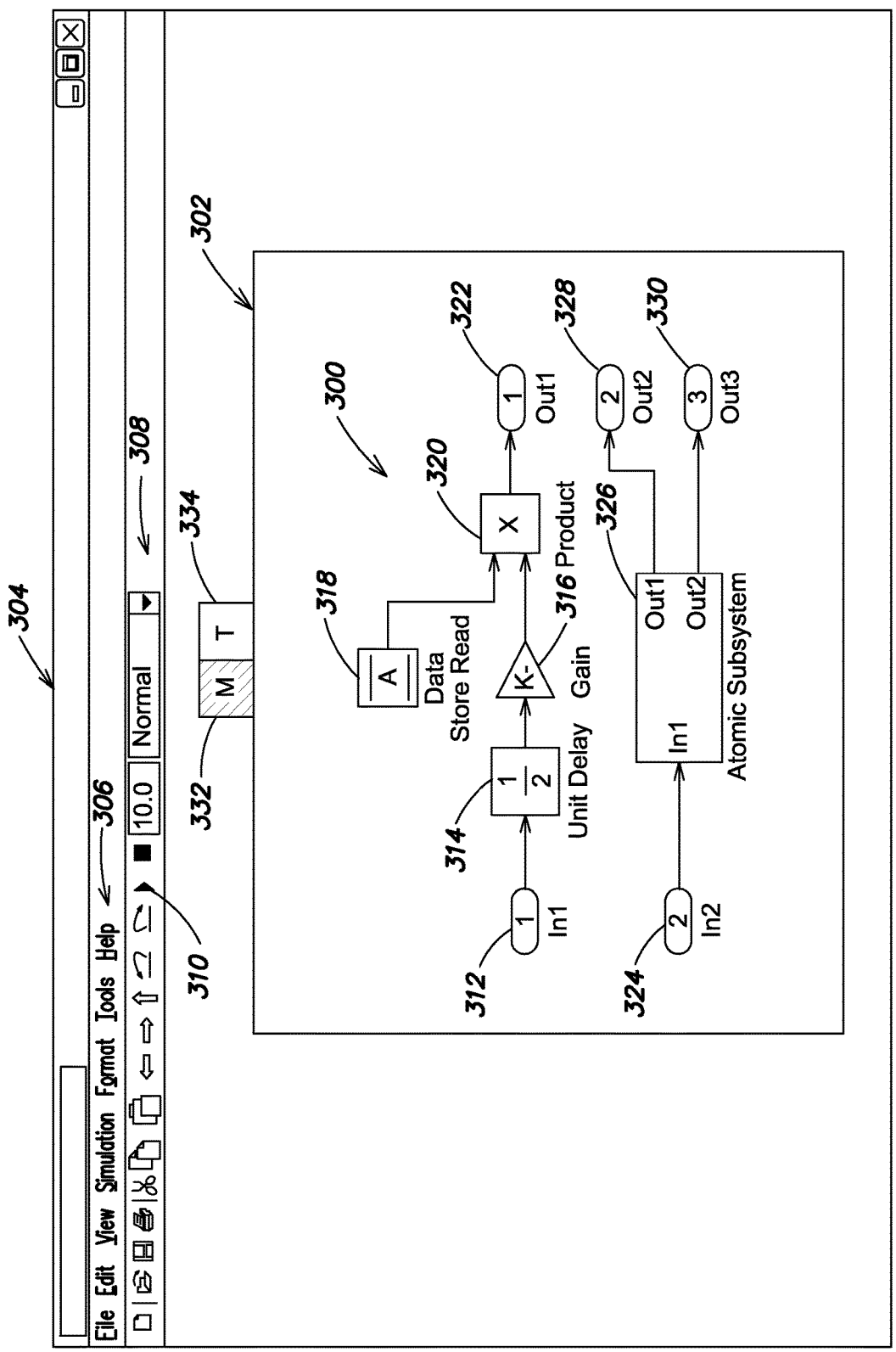
FIG. 3 is an illustration of a graphical design model having executable semantics in accordance with an embodiment of the present invention.

FIG. 3 is a schematic illustration of the design model 300, which may be a computer-generated graphical design model having executable semantics. The design model 300 may be opened or constructed on a model canvas 302 of a model editor 304. For example, a user may select a plurality of graphical objects, such as icons or blocks, from one or more libraries of pre-defined objects, and place the selected objects onto a model canvas that may be managed by the model editor 204. The user also may establish relationships, such as connections, among the blocks, which may or may not be visually represented on the model canvas. The graphical objects of the design model may represent dynamic systems, computations, functions, operations, events, or states, and the connections, which may appear as wires or arrows among the objects, may represent data, control, signals, events, mathematical relationships, physical connections, etc. In an embodiment, a set of interconnected blocks may be organized into a subsystem, and a set of states may be organized into a subchart.

In particular, the UI engine 202 and model editor 204 may provide or support a graphical user interface (GUI) that includes the model canvas for displaying a graphical design model. The graphical model may be a Simulink model, a Stateflow chart, a LabVIEW block diagram, a VEE diagram, a MATLAB file, a MatrixX model, etc. The design model may represent a real world, dynamic system, such as an aircraft flight controller, an engine control unit (ECU), a power window controller, an electronic circuit, a financial system or instrument, a natural phenomenon, such as a weather patterns, etc.

In addition to the model canvas 302, the model editor 304 may include a menu bar 306, and a toolbar 308, among other graphical elements. The toolbar 308 may include a Run button 310, among other command buttons. In response to a user selecting the Run button 310, for example with the mouse 118, the simulation engine 206 may execute the design model 300. Execution of the design model 300 may also be referred to as simulation of the design model 300.

The design model 300 includes a first Inport block (In1) 312 connected to a Unit Delay block 314, which is connected to a Gain block 316. The Gain block 316 and a Data Store Memory Read block 318 are connected to a Product block 320. The Product block 320 is connected to a first Outport block (Out1) 322. In addition, a second Inport block (In2) is connected to an atomic subsystem block 326, which is connected to second and third Outport blocks (Out2 and Out3) 328, 330. The atomic subsystem block 326 may itself represent, in a hierarchical manner, a plurality of interconnected graphical objects, such as blocks.

A design model may be specified graphically, textually or a combination of graphically and textually.

The design model may and typically does have an interface, which may be referred to as an external interface. The external interface of a design model may include the external inputs to the design model, the external outputs from the design model, the one or more initialization states, and the one or more parameters whose values may be defined for the design model. In an embodiment, values for the external inputs and outputs of the model may change over time. For example, one or more of the inputs and outputs may be time-varying signals, where the values of the one or more initialization states and parameters may not change with time. Instead, values for the one or more initialization states and the parameters may be set once for each execution, e.g., simulation, of the design model. To the extent the design model is a graphical model, such as a block diagram model, the external inputs and outputs may be defined graphically.

The external interface of a design model may also include one or more control signals that may be used in the design model to control the execution of one or more portions of the model, such as one or more conditional subsystems of the design model. Exemplary control signals for conditional subsystems include: an enable control signal, which may cause a respective subsystem to execute when the enable control signal is positive; a triggered control signal which may cause a respective subsystem to execute when a trigger event occurs; and a control flow signal that may cause a respective subsystem to execute under the control of another object of the design model, such as a control block.

The input to the subsystem block 326 is an internal input of the design model 300, and thus not part of the model's external interface. Similarly, the outputs of the subsystem block 326 are internal outputs, and thus not part of the model's external interface. Note, however, that the outputs of the subsystem block 326 drive the second and third Outport blocks 328, 330, which are external outputs, and thus part of the model's external interface.

In addition to the design model canvas 302, the model editor 304 may provide one or more test model canvases. In an embodiment, the model editor 304 may provide a design model tab (M) 332, and a test model tab (T) 334. A user may switch between the design model canvas 302 and a test model canvas by selecting, e.g., with the mouse 118, the respective tab 332, 334. Furthermore, the model editor 204 may assign test models opened or created in the test model canvas to the design model opened in the design model canvas 302. For example, the design model 300 and the test models opened or created in the test model canvas may be saved to a model workspace whose scope is set to the design model 300.

Interface Specification

Figure 4B:
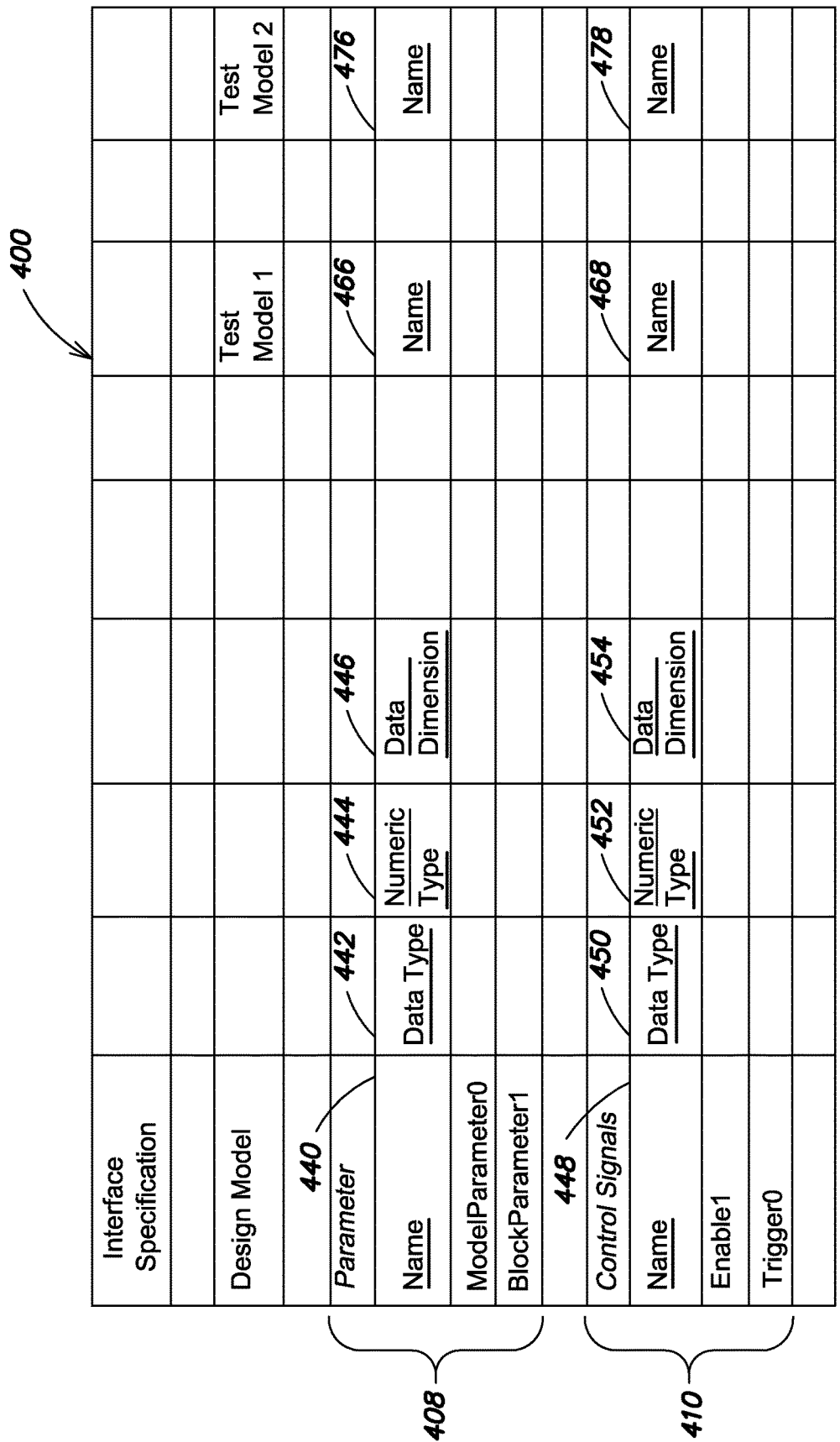

FIGS. 4A and B are a schematic illustration of an interface specification 400 for a design model. The interface specification 400 may be organized as a table having a plurality of columns and rows that define cells or records for storing information. The interface specification 400 may have a first section 402 for storing information concerning external inputs, a second section 404 for storing information concerning external outputs, a third section 406 for storing information concerning initialization states, a fourth section 408 for storing information concerning parameters, and a fifth section 410 for storing information concerning control signals.

Each section 402, 404, 406, 408, and 410 may include one or more rows for storing information concerning particular inputs, outputs, initialization states, parameters, and control signals. More specifically, the external inputs section 402 may include an external input name column 412, an external input data type column 414, an external input numeric type column 416, an external input data dimension column 418, and an external input sampling mode column 420. Examples of data types include unsigned 8-bit integer, double-precision floating point, single-precision floating point, and fixed point. Examples of numeric type include real or complex. Examples of dimensionality include one-dimensional, e.g., scalars and vectors, two-dimensional, e.g., arrays, or multi-dimensional, e.g., multi-dimensioned matrices. Examples of sampling modes include sample-based, in which a signal has one data sample, and frame-based, in which a signal includes a collection of sequential samples, e.g., from a single channel or multiple channels. Like the external inputs section 402, the external outputs section 404 may also include an external output name column 422, an external output data type column 424, an external output numeric type column 426, an external output data dimension column 428, and an external output sampling mode column 430. The initialization states section 406 may include an initialization state name column 432, an initialization state data type column 434, an initialization state numeric type column 436, and an initialization state data dimension column 438. The parameters section 408 may include a parameter name column 440, a parameter data type column 444, and a parameter data dimension column 446. The control signals section 410 may include a control signal name column 448, a control signal data type column 450, a control signal numeric type column 452, and a control signal data dimension column 454.

The interface specification 400 also may include information about the mapping between one or more associated test models and the external interface of the design model. In particular, the interface specification 400 may include a first region 456 for a first associated test model, a second region 458 for a second associated test model, and so on. One or more of the external inputs of the design model, as listed in the external inputs section 402, may map to external outputs of the test models, which may be listed in a name column 460 of the first region 456, and a name column 470 of the second region. The external outputs of the design model, as listed in section 404, may map to external inputs of the test models, which may be listed in name columns 462, 472 of the first and second regions 456, 458. The initialization states of the design model, as listed in section 406, may map to objects of the test models that set values to those initialization states, and the objects may be listed in name columns 464, 474 of the first and second regions 456, 458. The parameters of the design model, as listed section 408, may map to objects of the test models that set values to those parameters, and the objects may be listed in name columns 466, 476 (FIG. 4B) of the first and second regions 456, 458. The control signals of the design model, as listed in section 410, may map to objects of the test models that set values to those control signals, and the objects may be listed in name columns 468, 478 of the first and second regions 456, 458.

Depending on the particular design model, at least some of the sections may be empty, e.g., have no rows.

FIGS. 5A-E illustrate a flow diagram of a method in accordance with an embodiment of the invention. The modeling environment 200 may receive inputs, e.g., from a user, opening, constructing, editing, or analyzing one or more design models, which may be stored in main memory 104 or persistent memory 108, as indicated at block 502. The modeling environment 200 also may receive inputs, e.g., from a user, creating one or more test models for a given design model, or assigning one or more test models to the given design model, as indicated at block 504. The one or more test models also may be stored in main memory 104 or persistent memory 108. Like the design model, a test model also may be specified graphically, textually or a combination of graphically and textually. For example, a test model may be specified graphically as a test model. A test model may be created manually, e.g., by a user, or automatically, for example, by the automatic test model builder 244.

The broker 232 may analyze the design model 300 to identify the model's external interface, as indicated at block 506. For example, the broker 232 may evaluate an in-memory representation of the design model 300, such as representation constructed by the IR builder 222, and identify the design model's external inputs, outputs, initialization states, parameters, and control signals. Utilizing this information, the broker 232 may construct the interface specification 400, which may also be referred to as an interface definition, for the design model, as indicated at block 508.

The design model 300 includes two external inputs, i.e., the two Inport blocks (In1 and In2) 312, 324, and three external outputs, i.e., the three Outport blocks (Out1, Out2, and Out3) 322, 328, 330. The design model's interface also includes a plurality of parameters. Specifically, the data store memory read block 318, whose value may be set at the start of a simulation of the design model 300, represents a first parameter of the design model 300. In addition, instead of specifying a numeric value, such as '5', the Gain block 316 specifies its gain value as a variable, i.e., 'K'. The variable 'K', which also may be referred to as a parameter of the Gain block 316, is a second parameter of the design model 300. In particular, the value of K may be set at the start of a simulation of the design model 300.

The input to the subsystem block 326 is an internal input of the design model 300, and thus not part of the model's external interface. Similarly, the outputs of the subsystem block 326 are internal outputs, and thus not part of the model's external interface. Note, however, that the outputs of the subsystem block 326 drive the second and third Outport blocks 328, 330, which are external outputs, and thus part of the model's external interface.

The broker 232 also may identify one or more test models 230 that are associated with the design model 300, as indicated at block 510. In addition, the broker 232 may analyze each of the one or more associated test models, determine a mapping between the test models and the design model, and include this mapping information in the interface specification 400, as indicated at block 512.

In an embodiment, the design model 300 and one or more test models may register with the broker 232 in order to receive notifications of proposed changes to the interface specification 400. In another embodiment, each test model may register with the broker 232 to receive notifications of proposed interface specification changes. As part of the registration process, the design model 300 may specify one or more functions to be called in response to particular changes being made to the interface specification 400. For example, the design model 300 may specify a first function that causes a particular type of external input to be added to the design model 300, when the change to the interface specification is the addition of a new input. Similarly, each test model, e.g., as part of the registration process, may specify one or more functions to be called in response to particular changes to the interface specification 400.

Figure 5A:
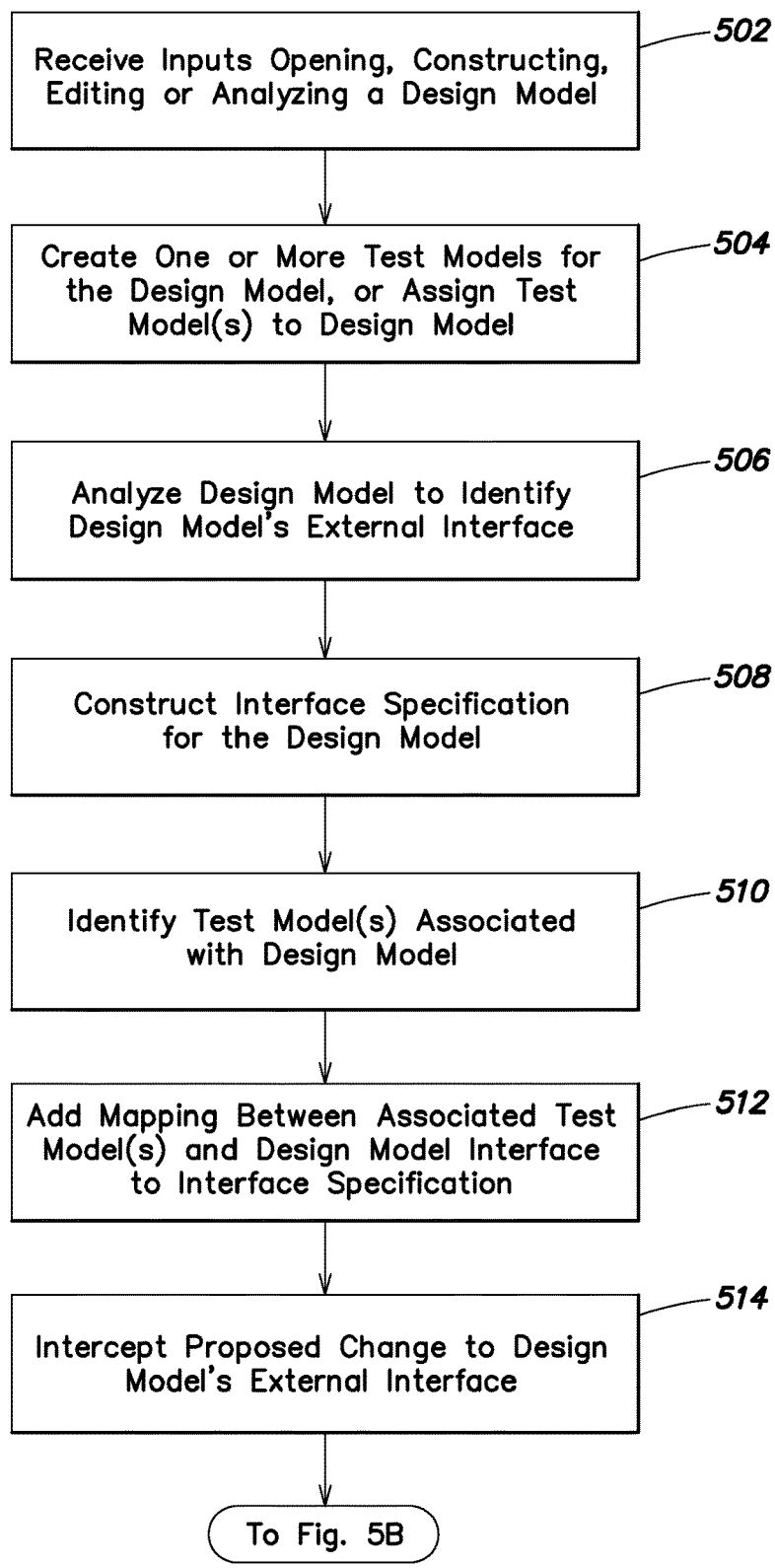
FIGS. 5A-E is a flow diagram of a method in accordance with an embodiment of the present invention.
Figure 5B:
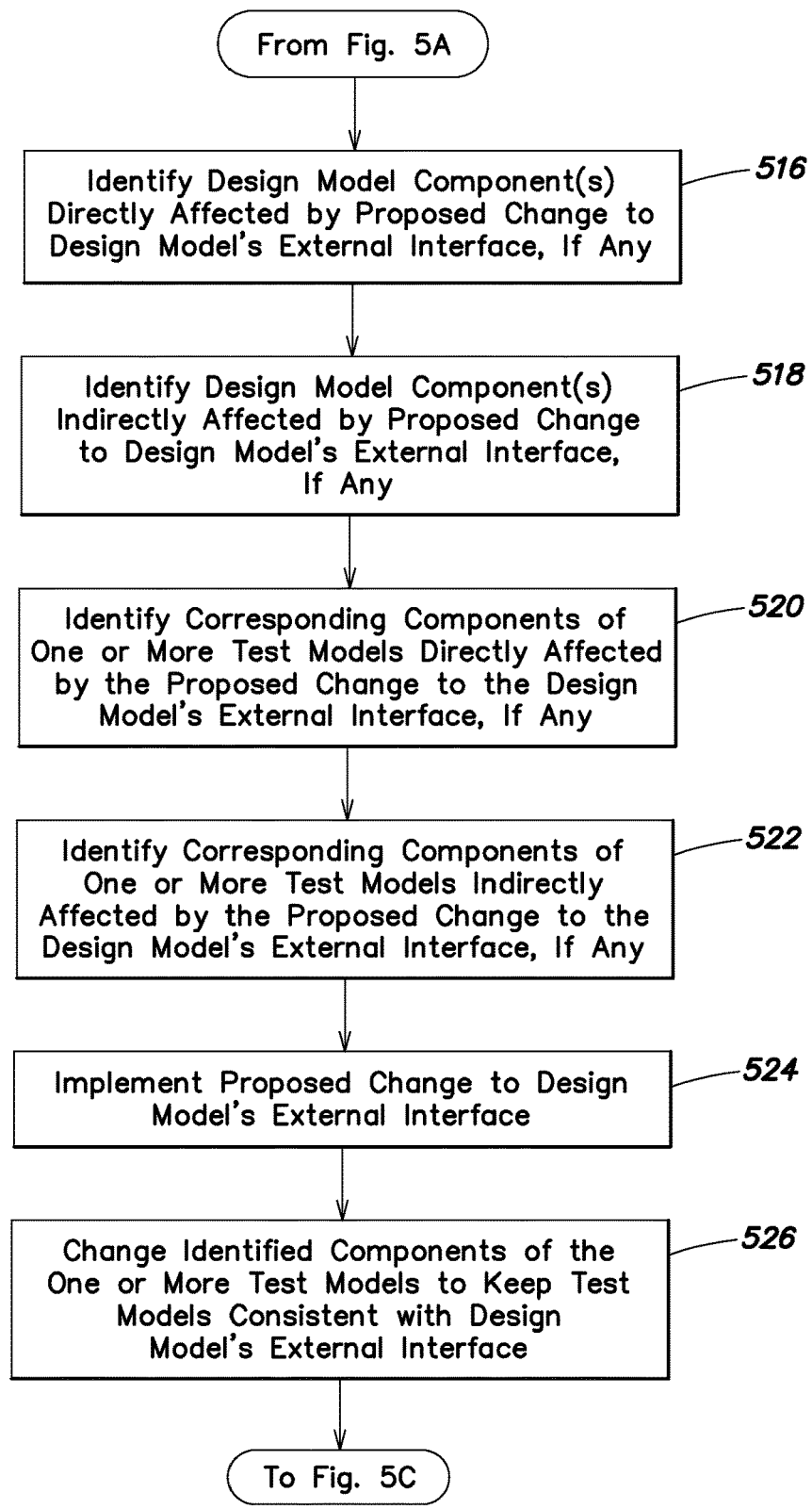

The broker 232 intercepts requested or proposed changes to the design model's external interface, as indicated at block 514. Exemplary changes, which may be user-initiated, e.g., through the model editor 204, include adding or removing an external input or an external output of the design model, and modifying the data type of an existing external input. The broker 232 may intercept the requested change before it is carried out, e.g., by the model editor 204. In an embodiment, the broker 232 may operate with the differencing engine 243 to identify proposed changes to the design model's external interface. For example, the differencing engine 243 may be adapted to detect proposed changes that affect the external interface of the design model 300, and to notify the broker 232 of such proposed changes. The broker 232 may examine the proposed change and, to the extent it represents a direct change to one or more components of the design model 300, the broker 232 may identify such components, as indicated at block 516 (FIG. 5B). To the extent the proposed change, if carried out, indirectly affects one or more components of the design model 300, the broker 232 may also identify such components, as indicated at block 518.

A proposed change may affect one or more components, without directly changing those components. For example, suppose the design model includes a plurality of external inputs that are numbered sequentially from 0-12. Suppose further that the proposed change is the deletion of external input 9. In this case, the proposed change directly affects external input 9, which is being deleted. The proposed change also indirectly affects external inputs 10-12, because the modeling environment 200 may be configured to renumber them as external inputs 9-11 following the deletion of original external input 9.

In an embodiment, the broker 232 may only intercept proposed changes to the design model's external interface. Other changes, for example, to internal interfaces of the design model, to internal graphical objects or subsystems, to model-level attributes, such as the solver to be used during model execution, etc., may not be intercepted by the broker 232. Instead, these changes may be implemented, e.g., by the model editor 204, as requested.

In addition to identifying the components directly and indirectly affected by the proposed change, the broker 232 may identify one or more components of the associated test models that are directly affected by the proposed change to the design model's external interface, as indicated at block 520. The broker 232 also may identify one or more components of the test models indirectly affected by the proposed change, as indicated at block 522. The broker 232 may utilize the mapping information from the interface specification 400 to identify the components of the one or more test models that correspond to the directly and indirectly affected components of the design model. For example, the broker 232 may identify the rows corresponding to the affected design model components, which may also identify corresponding components of the test models.

Suppose the proposed change is to delete the external output 'Out2' 328. The broker 232 may find the entry of the interface specification 400 that corresponds to the external output 'Out2' 328, and follow that entry to identify the components of the test models that correspond to the external output 'Out2' 328. In this case, the 'In2' component of the first test model, and the 'In2' component of the second test model correspond to the external output 'Out2' of the design model 300. The deletion of external output 'Out2' 328 may also result in external output 'Out3' 330 having to be renumbered to 'Out2,' to avoid any gaps in the sequence of outport numbers. Accordingly, the broker 232 may determine that deleting external output 'Out2' 328 also indirectly affects external output 'Out3' 330. Similarly, the broker 232 may determine that component 'In3' of test model 1, and component 'In3' of test model 2 will need to be renumbered as component 'In2' in response to deleting the existing component 'In2.' Accordingly, the broker 232 may determine that these two 'In3' components are indirectly affected by deleting external output 'Out2' 328, which results in the deletion of components 'In2' of the two test models.

Figure 5C:
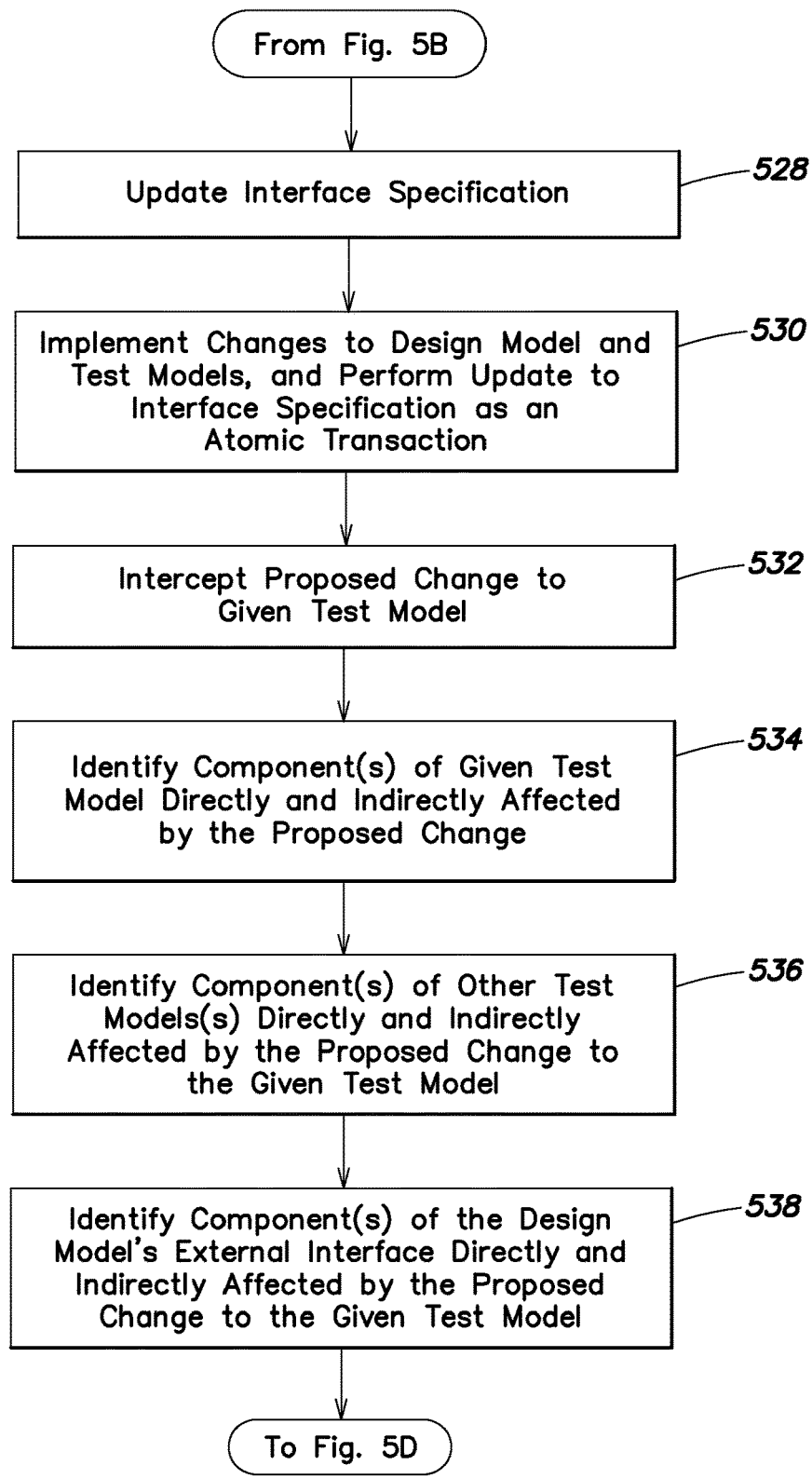

The broker 232 may then implement the proposed change to the design model's external interface, as indicated at block 524. In addition, the broker 232 may change the identified components of the one or more test models to keep the one or more test models consistent with the design model 300, as indicated at block 526. The broker 232 also may update the interface specification 400 to reflect the changes made to the design model 300 and to the one or more test models 230, as indicated at block 528 (FIG. 5C).

In an embodiment, the atomic transaction engine 236 executes the changes to the design model 300 and to the one or more test models 230, and also updates the interface specification 400 as an atomic transaction, as indicated at block 530. By changing the design model interface 400 and the one or more test models as an atomic transaction the broker 232 prevents the test models from becoming inconsistent with the external interface of the design model 300.

The broker 232 also may intercept changes directed to a given one of the test models 230 associated with a design model 300, as indicated at block 532. The broker 232 may examine the proposed change and determine the components of the given test model that are directly and indirectly affected by the proposed change, as indicated at block 534. The broker 232 also may identify the corresponding components of the other test models directly and indirectly affected by the proposed change to the given test model, as indicated at block 536. In addition, the broker 232 may identify the corresponding components of the design model's external interface that are directly and indirectly affected by the proposed change to the given test model, as indicated at block 538. The broker 232 may utilize the mapping information in the interface specification 400 to identify the corresponding components of the design model 300 and the other test models.

Figure 5D:
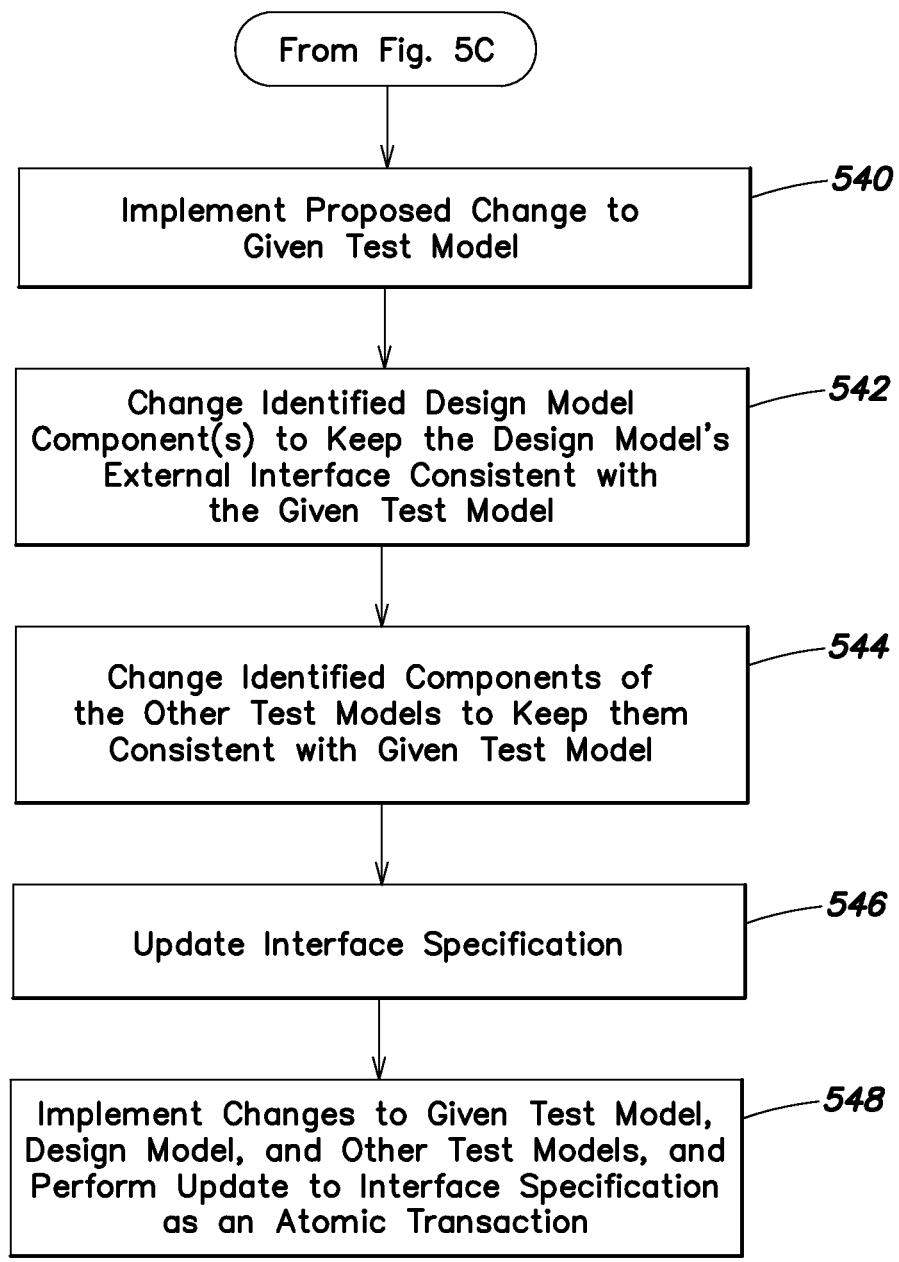

The broker 232 may implement the proposed change to the given test model, as indicated at block 540 (FIG. 5D). The broker 232 also may change the identified components of the design model to keep the design model interface consistent with the given test model, as indicated at block 542. In addition, the broker 232 may change the identified components of the other test models to keep them consistent with the given test model, as indicated at block 544. Furthermore, the broker 232 may update the interface specification 400 to reflect the changes to the given test model, the design model, and the other test models, as indicated at block 546. The changes to the given test model, the design model 300, and the other test models, and the updating of the interface specification 400 may all be performed as an atomic transaction, as indicated at block 548.

Figure 5E:
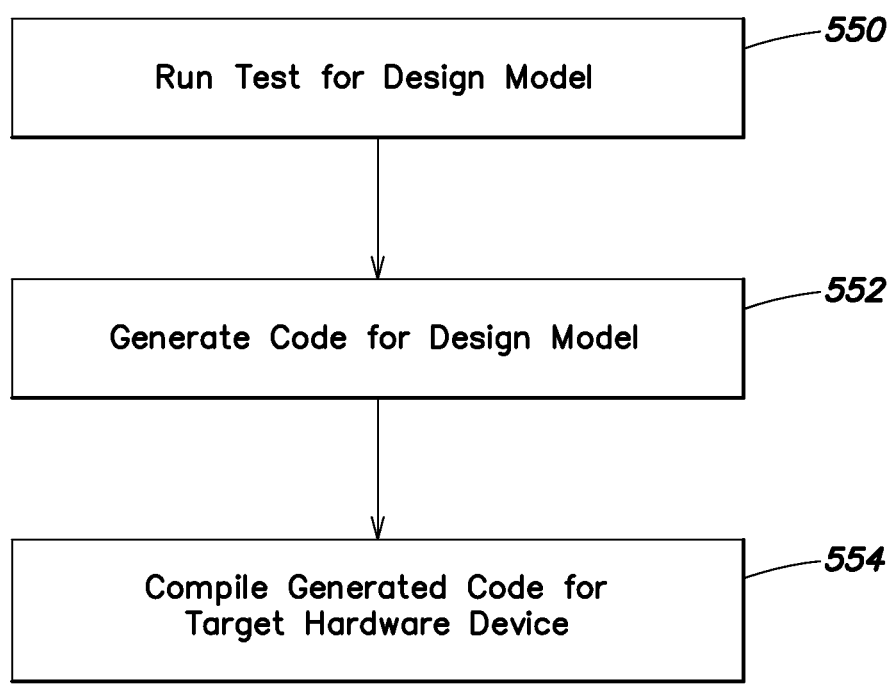

The design model 300 may be tested using one or more of the test models, as indicated at block 550 (FIG. 5E). For example, the design model 300 may be executed, e.g., simulated, using one of the test models, which may define values for model's external inputs, initialization states, parameters, and control signals, and may log or verify the model's external outputs.

In an embodiment, design model execution may be carried out over a time span, e.g., a simulation time, which may be user specified or machine specified. A compile stage may mark the start of execution of the design model, and may involve preparing data structures and evaluating parameters, configuring and propagating block characteristics, determining block connectivity, and performing block reduction and block insertion. The preparation of data structures and the evaluation of parameters may create and initialize one or more data structures used in the compile stage. For each of the blocks, a method may force the block to evaluate all of its parameters. This method may be called for all blocks in the design model. If there are any unresolved parameters, execution errors may be thrown. During the configuration and propagation of block and port/signal characteristics, the compiled attributes (such as data dimensions, data types, complexity, sample modes, and sample time) of each block (and/or ports) may be setup on the basis of the corresponding behaviors and the attributes of blocks (and/or ports) that are connected to the given block through lines, e.g., arrows. The attribute setup may be performed through a process during which block behaviors "ripple through" the design model from one block to the next following signal or other connectivity.

This process is referred to as "propagation." In the case of a block that has explicitly specified its block (or its ports') behaviors, propagation helps ensure that the attributes of the block are compatible with the attributes of the blocks connected to it. If not, an error may be issued. Secondly, in many cases, blocks are implemented to be compatible with a wide range of attributes. Such blocks may adapt their behavior in accordance with the attributes of the blocks connected to them. This is similar to the concept of polymorphism in object-oriented programming languages. The exact implementation of the block may be chosen on the basis of the design model in which the block finds itself. Included within this step are other aspects such as validating that all rate-transitions yield deterministic results, and that the appropriate rate transition blocks are being used. The compilation step also may determine actual block connectivity. For example, virtual blocks may play no semantic role in the execution of a design model. In this step, the virtual blocks may be optimized away, e.g., removed, and the remaining non-virtual blocks may be reconnected to each other appropriately. This compiled version of the design model with actual block connections may be used from this point forward in the execution process. The way in which blocks are interconnected in the design model does not necessarily define the order in which the equations (methods) corresponding to the individual blocks will be solved (executed). The actual order may be determined during the sorting step in compilation. In an embodiment, once the compilation step has completed, the sorted order may not be changed for the entire duration of the design model's execution.

This same compilation stage may also be performed for one or more of the test models.

Following the compilation stage, code may or may not be generated for the design model 300, as indicated at block 552. If code is generated, the design model 300 may be executed through an accelerated execution mode in which the design model 300, or portions of it, is translated into either software modules or hardware descriptions, which is broadly referred to herein as code. If this stage is performed, then the stages that follow use the generated code during the execution of the design model. If code is not generated, the design model may execute in an interpretive mode in which the compiled and linked version of the design model may be directly utilized to execute the design model over the desired time-span. When users generate code for a design model, they may choose to not proceed further with the model's execution. Instead, they may choose to take the code and deploy it outside of the confines of the modeling environment 200.

In addition, the code generator 240 may generate code for the design model, as previously indicated at block 552, and may store the generated code for the design model in memory, e.g., persistent memory, such as the hard drive 108. The UI engine 202 may provide or support a Code Generation button in the GUI that may be selected by the user, or the UI engine 202 may receive a code generation command entered by the user, e.g., in the GUI or the CLI. The code generation command also may be invoked programmatically, for example, when a particular event occurs. In response to the code generation command being activated, the code generator 240 may generate code for the design model.

In an embodiment, the generated code may be textual code, such as textual source code, that may be compiled and executed on a target machine or device. The generated code may conform to one or more programming languages, such as Ada, Basic, C, C++, C#, SystemC, FORTRAN, VHDL, Verilog, embedded MATLAB, a vendor or target specific HDL code, such as Xilinx FPGA libraries, assembly code, etc. For example, one or more code generation files, such as header, main, make, and other source files may be generated for the design model. The target language compiler 242 may compile the generated code for execution by target hardware, such as a microprocessor, a Digital Signal Processor (DSP), a Field Programmable Gate Array (FPGA), etc., as indicated at block 554. In an embodiment, the code generator 240 also may generate code for some or all of the test model(s), and this generated code also may be compiled by the target language compiler 242.

In an embodiment, the broker 232 may be implemented through the well-known model-view-controller paradigm. Here, the interface specification 400 may be equated with the 'model', the design model 300 and the test models 230 may be equated with the 'views', and the broker 232 may be equated with the 'controller'. The model-view-controller paradigm is described in S. Burbeck, *Application Programming in Smalltalk-80: How to use Model-View-Controller (MVC)*, University of Illinois in Urbana-Champaign (UIUC) Smalltalk Archive, and in S. Morse et al., *Introducing Application Design and Software Engineering Principles in Introductory CS Courses: Model-View-Controller Java Application Framework*, Journal of Computing Sciences in Colleges, Vol. 20, Issue 2 (December 2004), which are hereby incorporated by reference in their entireties.

The broker 232 may be implemented using other software paradigms, such as semaphore technology, etc.

In an embodiment, the design model 300 and each test model 230 are separate, stand-alone objects that are distinct from each other, although they form a group or entity for purposes of changes to the interface specification 400. The design model 300 and the test models 230 may be separate partitions within a single container. For example, the design model 300 may be a design model type file, such as a .mdl file, and the test models 230 may be test model type models stored within a container, such as a single zip or tar file, a single folder, a single directory, or a single project. The container, such as the zip or tarr file or the folder, directory or project, may also include the interface specification 400.

By maintaining the design model 300 and the test models 230 as separate and distinct files, objects or other entities, changes (other than changes to the interface specification) may be made to one without causing changes in the other. For example, because they are created and maintained as separate entities, such as separate objects or files, the propagation of block or signal attributes cannot occur between a test model 230 and the design model 300, or between the design model 300 and a test model 230. Accordingly, changes (other than to the interface specification 400) may be made to the design model 300 or to a test model 230 without affecting the other. For example, changes to the internal input/output of the design model 300, to the algorithm represented by the design model 300, etc., do not alter or influence the execution behavior of the test models 230. Similarly, changes to a test model, other than to the interface specification 400, do not alter or influence the execution behavior of the design model 300 or the other test models.

Furthermore, if the only change to a test model is the addition of a new test sequence or a new test vector, then a test engineer may run just the new test sequence or test vector, rather than re-running all of the tests associated with the design model 300.

In another embodiment, the broker 232 may be configured to synchronize changes to the design model's external interface with changes to the test models associated with the design model 300. For example, instead of intercepting proposed change requests, the broker 232 may log changes to the external interface whether those changes are initiated from the design model 300 or one of the test models 230. Specifically, the broker 232 may log the entity making the change, and the particular change being made. At a predetermined point, the broker 232 may examine the log, and apply the logged changes to the design model 300 and/or one or more test models 230 associated with the design model 300, thereby synchronizing the test models 230 and the design model 300. The predetermined point may be set to a particular number of pending changes in the log, to a particular time interval between updates, or other criteria.

Figure 6:
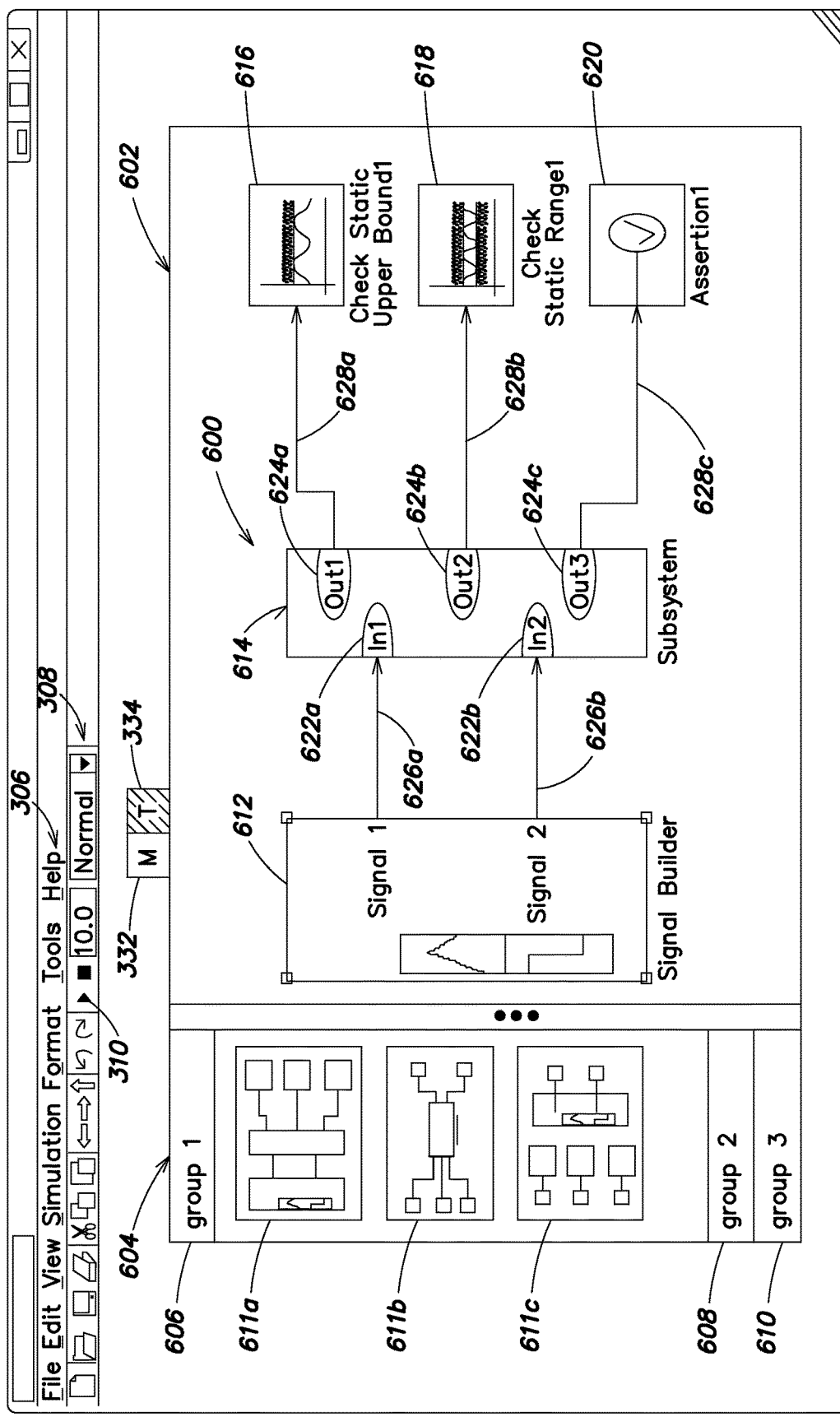
FIG. 6 is an illustration of a test model having executable semantics in accordance with an embodiment of the present invention.

FIG. 6 is a schematic illustration of a test model 600 opened or constructed on a test model canvas 602, which may be accessed by selecting the test model tab (T) 334. In addition to the test model canvas 602, a test model project pane 604 may be provided. The test model project pane 604 may contain at least some of the test models assigned to or associated with the design model 300 (FIG. 3). In an embodiment, pane 604 includes all of the test models. The plurality of test models may be organized into groups or folders within the project pane 604, such as 'Group 1' 606, 'Group 2' 608, and 'Group 3' 610. A given group or folder, such as 'Group 1' 606, may be opened, for example through user selection with the mouse 118, and the test models contained in that group or folder may be represented by thumbnail images, such as thumbnails 611a-c, within the project pane 604. By selecting the thumbnail image, such as thumbnail 611a, for a particular test model from the project pane 604, the respective test model, such as the test model 600, may be opened and presented in the test model canvas 602. Other objects instead of thumbnails may be used in the project pane 604. For example, the project pane 604 may contain a list of entries where each entry is a test model.

The test model 600 may include one or more objects adapted to drive the external inputs of the design model 300 (FIG. 3), one or more objects adapted to receive external outputs of the design model 300, for example for logging or verification purposes, and one or more objects for specifying values to the design model's initialization states, parameters, and control signals. Specifically, the test model 600 includes a Signal Builder block 612 that is connected to a subsystem block 614, which represents the design model 300, and three verification blocks 616, 618, 620. Just like the design model 300, the subsystem block 614 has two inputs (In1 and In2) 622a, 622b, and three outputs (Out1, Out2, and Out3) 624a-c. The Signal Builder block 612 is a source block that is used to create one or more groups of time-varying signals. The Signal Builder block 612 provides two signals (Signal 1 and Signal 2) 626a, 626b that are connected to the inputs (In1 and In2) 622a, 622b of the subsystem block 614 for providing input test signals. The outputs (Out1, Out2, and Out3) 624a-c of the subsystem block 614 are connected to the verification blocks 616, 618, 620. The first verification block 616 is adapted to perform a upper bound check on a first external output signal 628a of the subsystem block 614. The second verification block 618 is adapted to perform a range check on the second external output signal 628b, and the third verification block 620 is adapted to check whether the third external output signal 628c is asserted.

Figure 7:
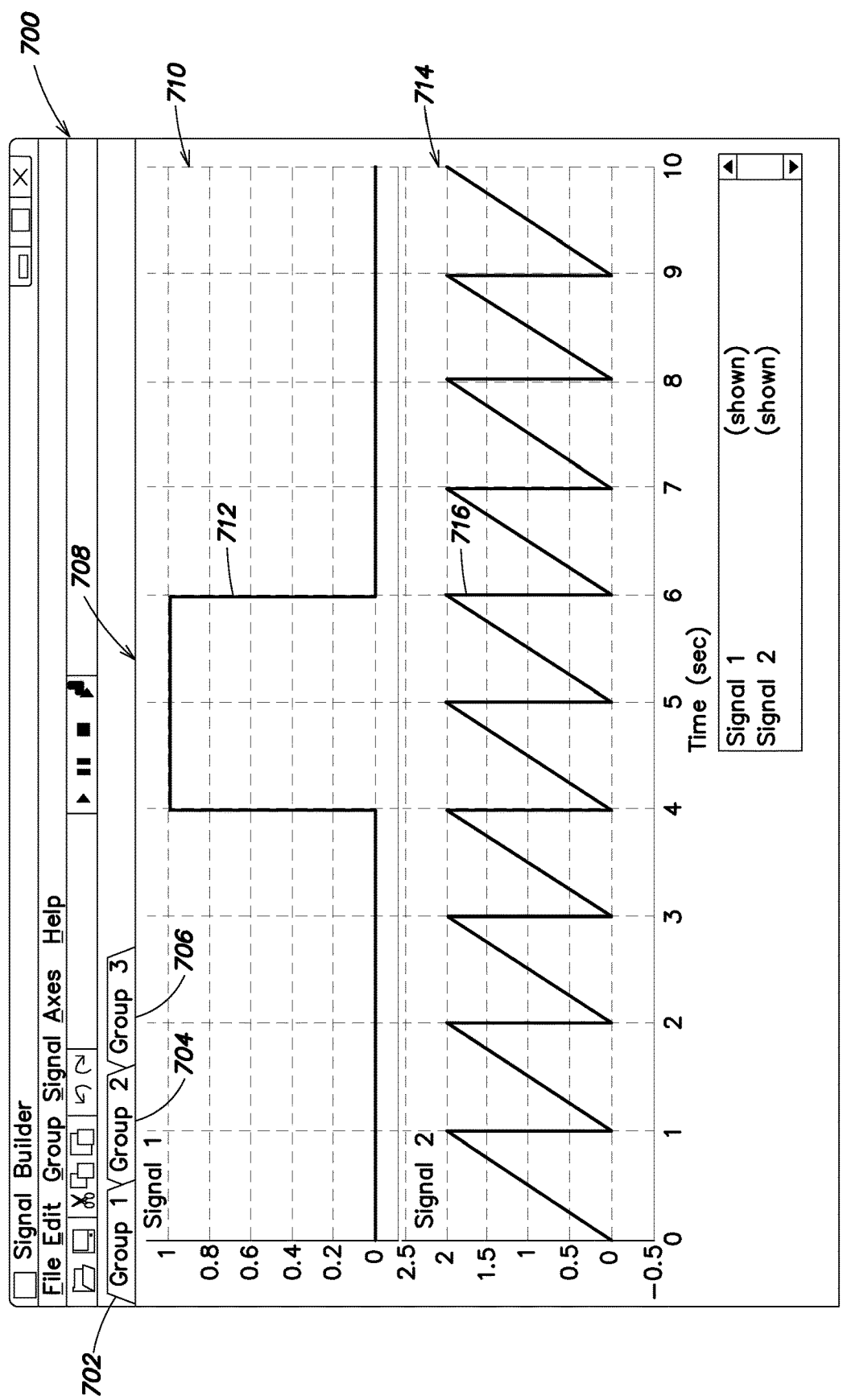
FIG. 7 is an illustration of a configuration window for a source component of the test model of FIG. 6.

FIG. 7 is a schematic illustration of a configuration window 700 for the Signal Builder block 612. The configuration window 700 includes a series of tabs, such as tabs 702, 704, 706, and each tab 702, 704, 706 corresponds to a respective group of signals defined by the Signal Builder block 612. The signals defined for a selected group, such as 'Group 1,' tab 702, are presented in a signal group pane 708, which may contain a configurable waveform designer for each signal in the group. As shown, the first signal (signal 1) of 'Group 1' is defined in a first waveform designer 710 as a step signal 712. The second signal (signal 2) of 'Group 1' is defined in a second waveform designer 714 as a triangle wave 716 whose amplitude ranges from '0' to '2'. The other Groups may be define different waveforms for the output signals (signal 1 and signal 2) of the signal builder block 612, such as other step or triangle waves, constant values, ramp signals, square waves, etc.

Suppose a proposed change is received to the interface specification 400, and that the proposed change is to add a new Inport block to the design model 300, and to connect this new Inport block to a new input defined for the subsystem block 326. The broker 232 may identify the test models that are associated with the design model 300, and a determine a corresponding change to be made to these test models in order to keep the test models consistent with the design model 300 following the proposed change. Regarding the test model 600, the broker 232 determines that the Signal Builder block 612 provides test signals to the external inputs of the design model 300, as represented in the test model 600 by the subsystem block 614. In order to keep the test model 600 consistent with the design model 300 following the proposed change, the broker 232 may determine that the test model 600 should be changed by adding new output to the Signal Builder block 612, and connecting this new output to the new Inport block being added to the design model 300. The broker 232 may also determine the updates that are to be made to the interface specification 400. The broker 232 may then modify the design model 300, the test model 600, and the interface specification 400 as an atomic transaction. It should be understood that the broker 232 may alternatively control other entities that modify the design model and the test models.

In another embodiment, the broker 232 may determine that one or more new components should be added to the test models, such as a new Signal Builder or other source block.

Figure 8:
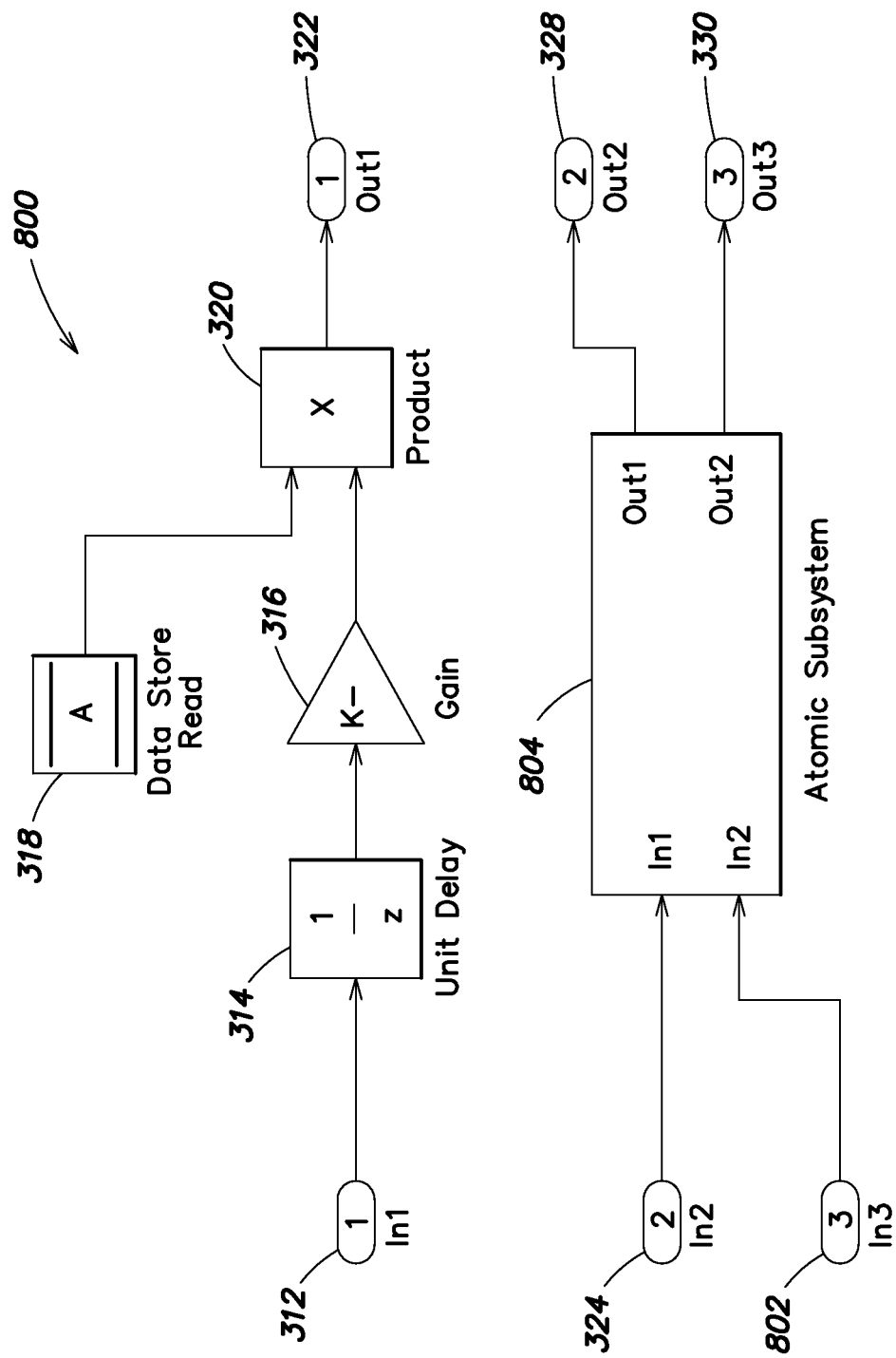
FIG. 8 is a modified version of the graphical design model of FIG. 3.

FIG. 8 is a schematic illustration of a design model 800 as modified by the proposed change. The modified design model 800 includes a new Inport block 802 that is connected to a new input (In2) of a modified subsystem block 804. Because the new input 'In2' of the subsystem block 804 represents an internal input of the design model 800, no corresponding change needs to be made to the test models.

Figure 9:
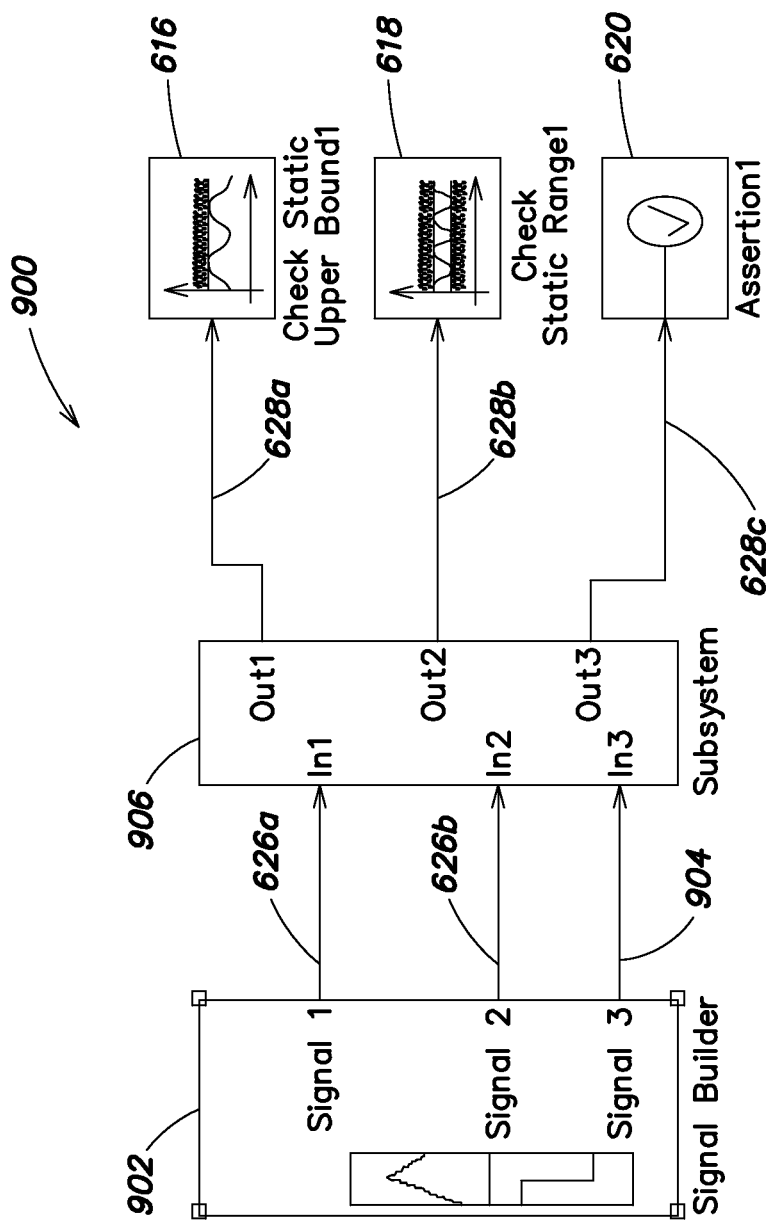
FIG. 9 is a modified version of the test model of FIG. 6.

FIG. 9 is a schematic illustration of a test model 900 as modified to maintain consistency with the changed design model 800. The modified test model 900 includes a Signal Builder block 902 modified to have a new output signal (Signal 3) 904 that is connected to a new input (In3) of a modified subsystem block 906, representing the modified design model 800.

Figure 10:
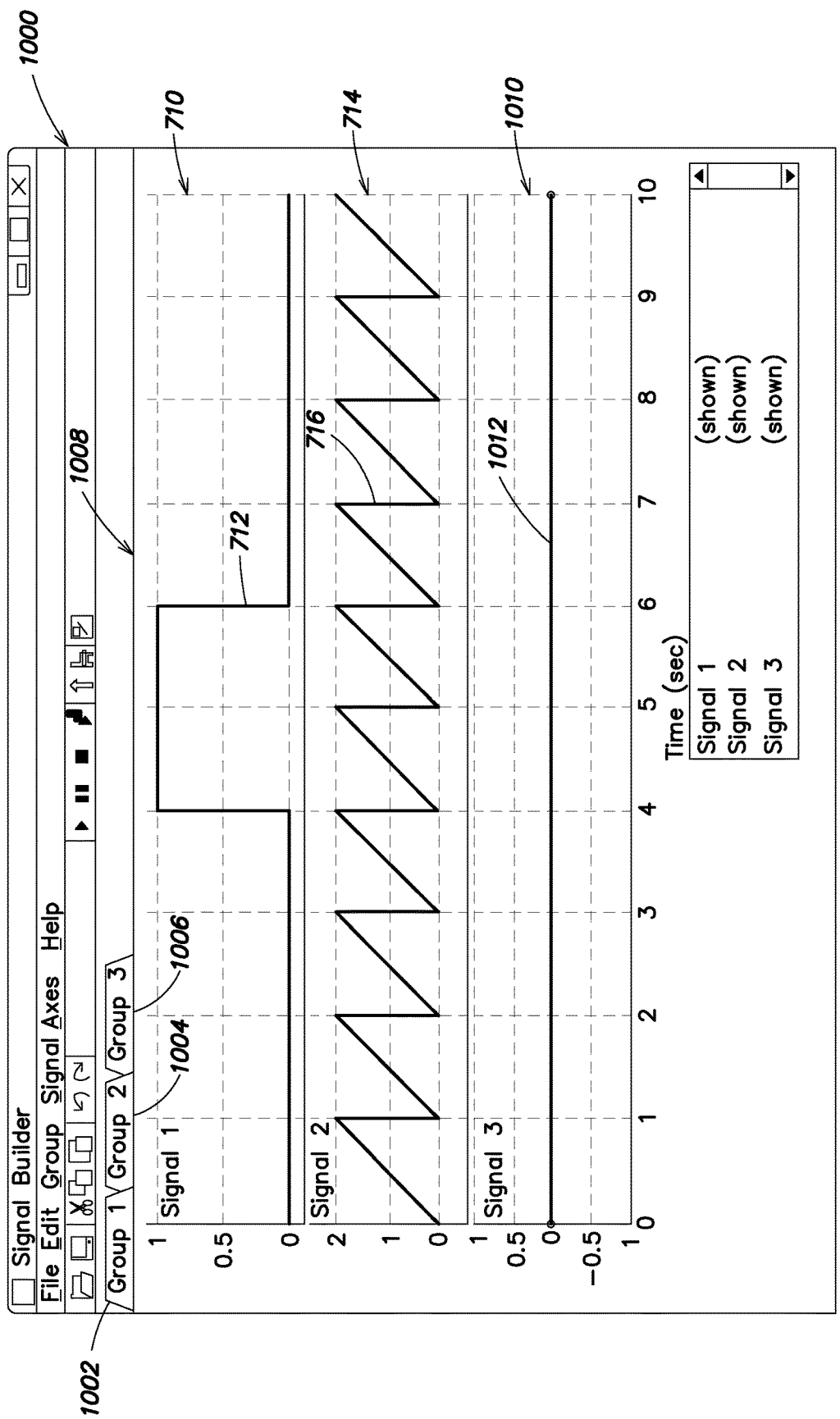
FIG. 10 is an illustration of a configuration window for a modified version of the source component of FIG. 7.

In addition to adding the new output port 904 for the Signal Builder block 902 of the modified test model 900, the broker 232 also may modify each group of signals defined by the Signal Builder block 902 automatically to specify a signal value for the new output. FIG. 10 is a schematic illustration of a configuration window 1000 for the modified Signal Builder block 902. The configuration window 1000 includes tabs 1002, 1004, 1006 for the three signal groups ('Group 1', 'Group 2', 'Group 3') defined by the Signal Builder block 902. A signal group pane 1008 shows the signals for the selected tab, e.g., tab 1002 '(Group 1).' The broker 232, however, has modified all of the signal groups automatically to include a new signal (Signal 3) that is provided on the block's new output signal 904. Specifically, the configuration window 1000 includes a third waveform designer 1010 within the signal group pane 1008. The broker 232 may be adapted to define automatically a default signal profile value for such added signals. For example, the broker 232 may be adapted to set the value of the new signal at a constant value of, e.g., zero. Accordingly, the third waveform designer 1010 displays a constant signal 1012.

In other embodiments, the default signal value applied to new signals may be user specified. For example, for a given design model, a user may specify that newly added signals have a value '1' or some other value.

Figure 11:
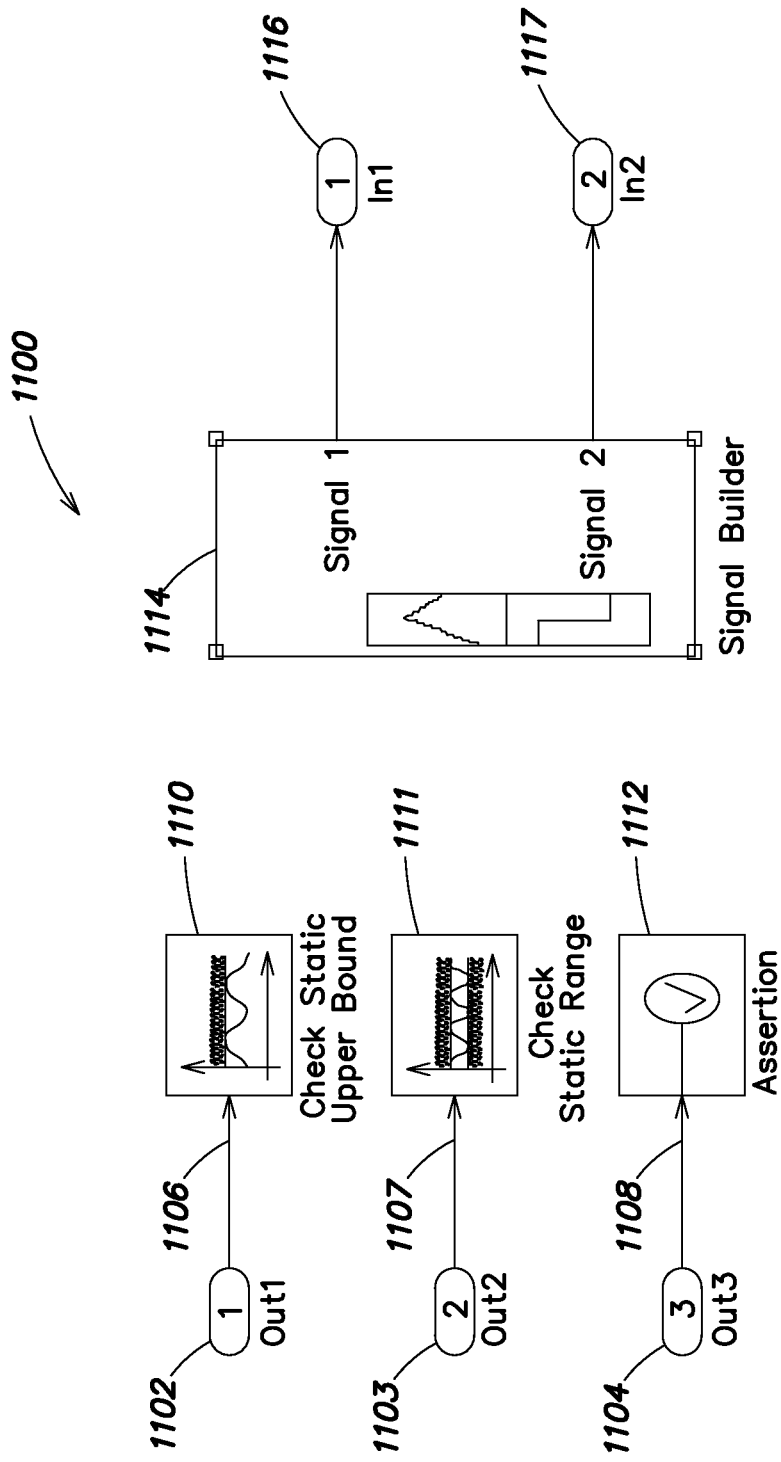
FIG. 11 is an illustration of a test model in accordance with another embodiment of the present invention.

Other test models or tests may be created manually or automatically for the design model 300. For example, an open loop test model may be created. FIG. 11 is a schematic illustration of an exemplary open loop test model 1100. The open loop test model 1100 may include one or more inputs, such as Inport blocks 1102-1104. Each Inport block 1102-1104 may be linked to a respective external output of the design model 300. The inputs of the open loop test model 1100 may be connected to one or more logging or verification objects. For example, the Inport blocks 1102-1104 may be connected, e.g., by signal lines 1106-1108, to verification blocks 1110-1112, respectively. The open loop test model 1100 also may include one or more source blocks, such as a Signal Builder block 114, connected to one or more outputs, such as Outport blocks 1116, 1117. The Outport blocks 1116, 1117 may be linked to the external inputs of the design model 300. The open loop test model 1100 may not include an object representing the design model 300.

Figure 12:
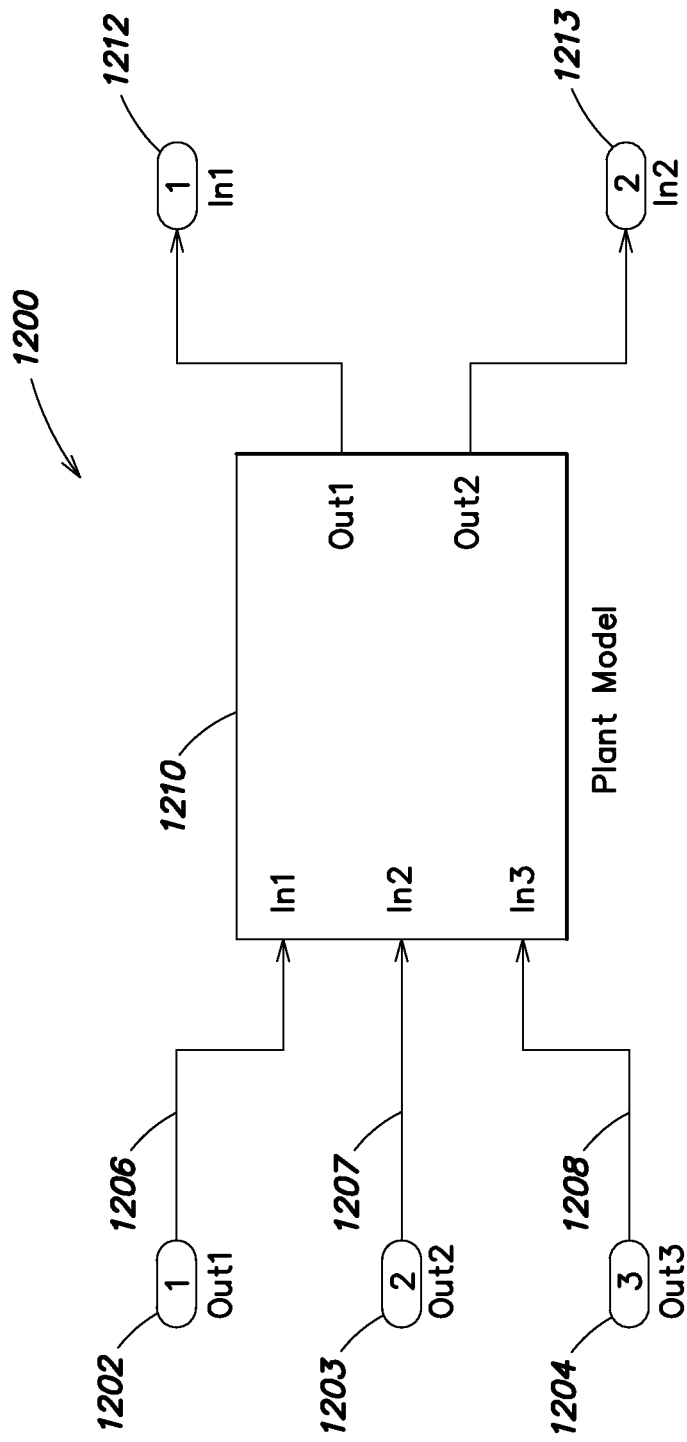
FIG. 12 is an illustration of a test model in accordance with another embodiment of the present invention.

Another type of test model is a closed loop test model. FIG. 12 is a schematic illustration of a closed loop test model 1200. The closed loop test model 1200 may include a plurality of inputs, such as Inport blocks 1202-1204 that may be linked to respective external outputs of the design models 300. The inputs may be connected to one or more test model objects of the closed loop test model 1200. For example, the Inport blocks 1202-1204 may be connected, e.g., by signal lines 1206-1208 to one or more subsystem blocks, such as a first subsystem block 1210. The first subsystem block 1210 may be a plant subsystem block, and may be configured to model the operation of a plant, such as a manufacturing plant or other physical plant. The plant model subsystem block 1210 may have one or more outputs that are connected to outputs of the closed loop model 1200. More specifically, the plant model subsystem block 1210 may have two outputs that are connected to two Outport blocks 1212, 1213. The Outport blocks 1212, 1213 may be linked to respective external inputs of the design model 300. The closed loop test model 1200 may not include any object representing the design model 300.

Another type of test model may be or may include a Human Machine Interface (HMI) that is linked to a design model. The HMI may be opened or constructed, for example by a user or other developer interacting with a graphical user interface (GUI) builder tool. The GUI builder tool may include one or more libraries having GUI elements, such as buttons, displays, etc., that may be selected and used to construct a particular HMI. A suitable GUI builder tool is the Gauges Blockset software tool from The MathWorks, Inc.

Figure 13:
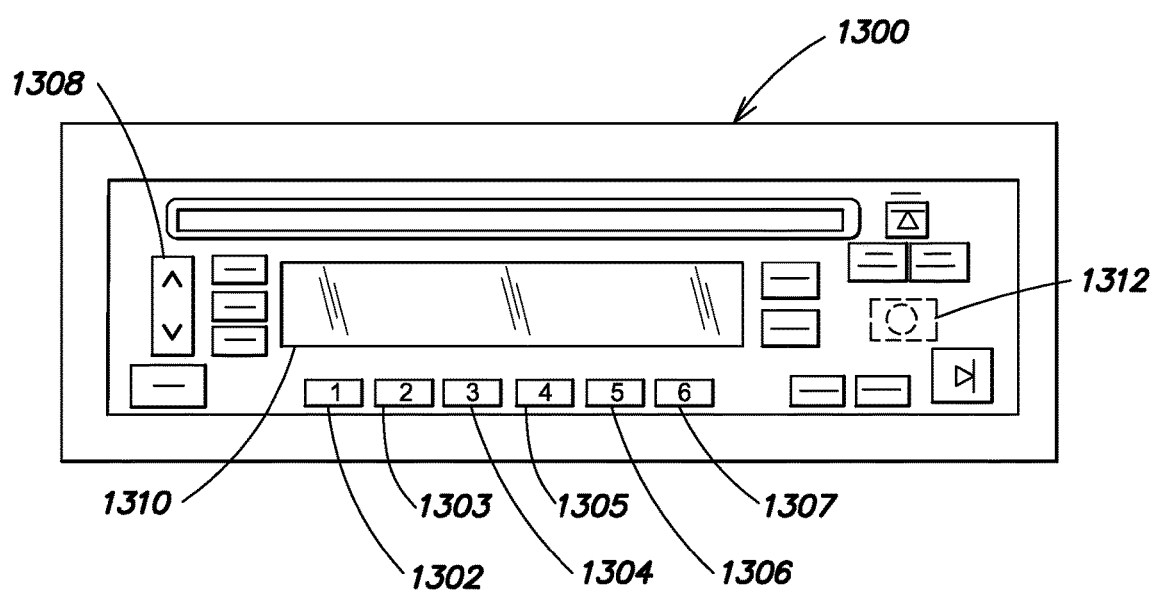
FIG. 13 is an illustration of a Human Machine Interface (HMI) test model in accordance with an embodiment of the present invention.

FIG. 13 is a schematic illustration of a graphical HMI test model 1300. The HMI test model 1300 may be linked to a design model (not shown). The HMI 1300 may model the user interface of a system under design or test, such as a car radio or audio system. The design model may model the operation of the car radio or audio system. The HMI 1300 may include one or more input buttons, and one or more display elements. Specifically, the HMI 1300 may include a plurality of station preset buttons 1302-1307, and a volume control button 1308, among others. The HMI 1300 also may include a multi-line digital display element 1310. Each input button 1302-1308 of the HMI 1300 may be linked to an external input of the design model. In an embodiment, one or more of the input buttons 1302-1308 may be operated by a user, such as a test engineer, e.g., with a mouse or a touch screen on which the HMI 1300 may be displayed. In addition, each display element of the HMI 1300, such as multi-line digital display element 1310, may be linked to an external output of the design model.

One or more test specifications may be created for the HMI 1300. The test specifications may specify a sequence of button presses. To run the test, a test engineer may press the input buttons 1302-1308 of the HMI 1300 in the sequence specified by the test specification. The test specification may also specify the expected output that is to be presented on the multi-line digital display element 1310 of the HMI 1300. During the test, the test engineer may record or monitor the data or information presented on the multi-line digital display element 1310 of the HMI 1300. The test model that includes the HMI 1300 also may include one or more objects or components adapted to log the button presses entered by the test engineer during the test. Accordingly, if an unexpected output is presented on the multi-line digital display element 1310 of the HMI 1300, or some other unexpected result occurs during the test, the test engineer may stop the test, and examine the log of button presses. This examination may lead to the creation of one or more additional test sequences in order to track down the cause of the unexpected output or error condition.

In another embodiment, the test model that includes the HMI 1300 may be adapted to perform one or more sequences of button presses automatically. For example, the test model may include a test script that calls for a sequence of button presses to be performed. In this case, a test engineer may monitor the sequence of button presses as they occur during the test. That is, as each button press occurs, the respective button on the HMI 1300 may change appearance briefly. For example, the button may briefly change color, intensity, etc. The test engineer may also monitor or record the data or other information presented on the multi-line digital display element 1310. If an error or other unexpected occurrence is detected, the test engineer may suspend the test, examine the log or other components, and define further testing of the HMI 1300 and/or the design model.

As with other test models, the broker 232 may construct an interface specification for the design model and the HMI 1300. If a change is proposed to the interface specification, the broker 232 may determine the corresponding change to be made to the HMI 1300. For example, suppose a new external input is added to the design model. The broker 232 may determine that a new input button needs to be added to the HMI 1300. Furthermore, the addition of the new external input to the design model and the addition of the new input button to the HMI 1300 may be performed atomically. The HMI 1300 and/or the test model that includes the HMI 1300 may specify one or more functions to be called in response to particular proposed changes to the interface specification. For example, the function may call for an input button having a default format to be placed in a default location on the HMI 1300. In addition, the function may call for a message or a warning to be presented, e.g., displayed, to the user. The message or warning may notify the user that a change to the HMI 1300 has been made that requires further input from the user. An exemplary message is "New Layout Required". The message may be designed to cause the user may modify the format, appearance, and/or location of the newly added button to the HMI 1300 to a desired format, appearance, and/or location.

For example, if a new external input is added to the design model linked to the HMI 1300, the broker 232 may cause a new button to be added to the HMI 1300, such as new button 1312, which is shown in dashed outline.

Distributed Environment

Figure 14:
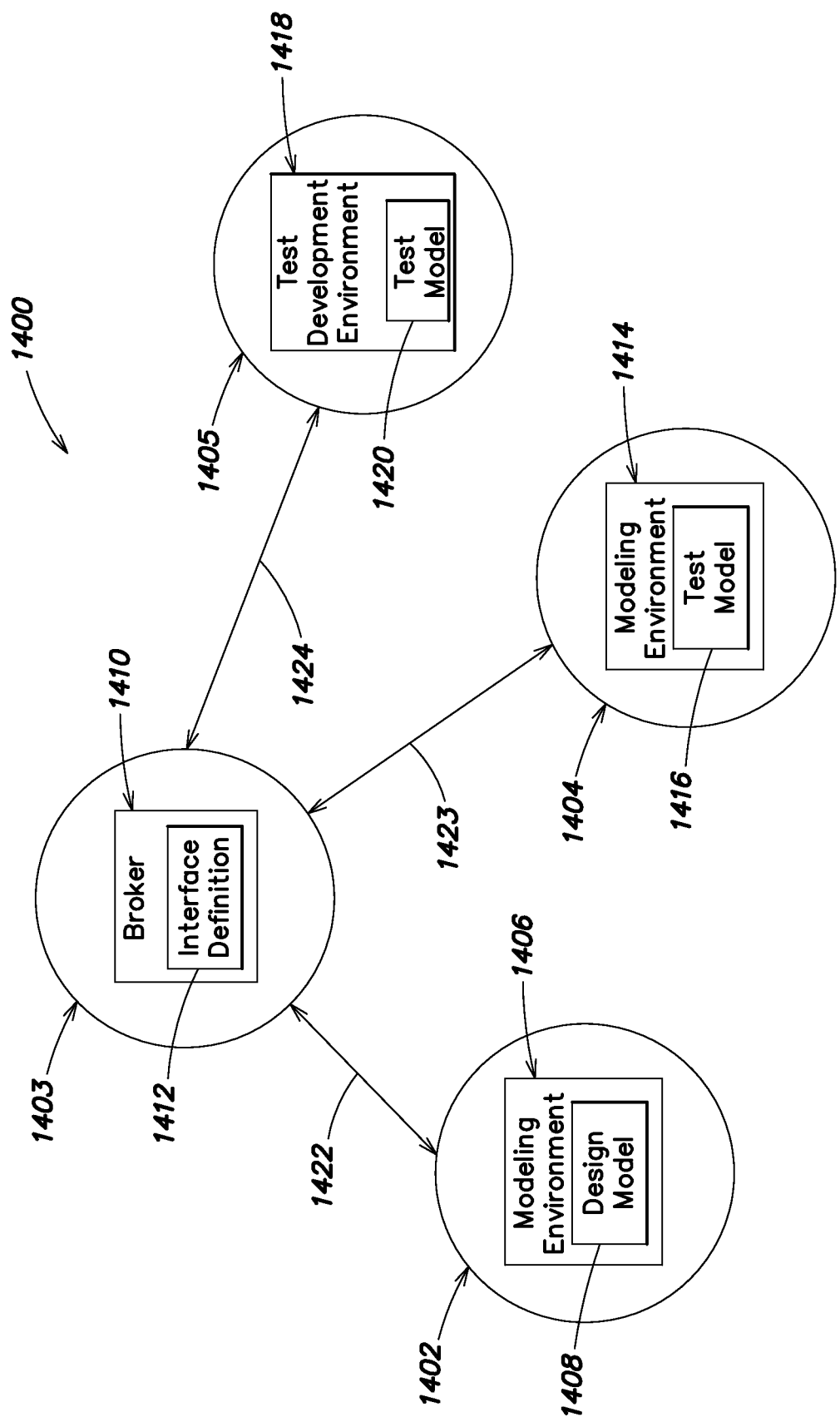
FIG. 14 is a schematic illustration of a distributed computing environment in accordance with an embodiment of the present invention.

In addition to being implemented on a single data processing device, such as a workstation, the present invention may be implemented in a distributed environment or architecture. FIG. 14 is a schematic illustration of the present invention implemented as a distributed system 1400. In the embodiment of the distributed system 1400, components of the present invention are located, e.g., running, on separate nodes, such as separate workstations or servers that are in communicating relationship with each other.

The distributed system 1400 may include a plurality of nodes, such as nodes 1402-1405. Each node 1402-1405 may be a separate data processing device, such as a workstation, a server, etc., and may include some or all of the elements of the data processing system 100 (FIG. 1). The first node 1402 may include a modeling environment 1406 that may be used to open or construct a design model 1408. The second node 1403 may include a broker 1410 that controls an interface definition 1412 created for the design model 1408. The third node 1404 may include a modeling environment 1414 in which a test model 1416 may be opened and/or constructed. The fourth node 1405 may include a test development environment 1418 in which a test model 1420 may be opened and/or constructed. Local agents (not shown) of the broker 1410 may also be running on the first, third and fourth nodes 1402, 1404, 1405.

The modeling environments 1406, 1414 running on the first and third nodes 1402, 1404 may be separate instances of the same type of modeling environment or they may be different modeling environments. The design model 1408, the test model 1416, and the test model 1420 may register with the broker 1410 to receive notifications concerning proposed changes to the interface definition 1412.

The first, third and fourth nodes 1402, 1404, 1405 may be operatively coupled to the second node 1403 that hosts the broker 1410, as indicated by bi-directional arrows 1422-1424. The arrows 1422-1424 represent communication links or channels among the respective nodes. Suitable communication channels include one or more virtual private networks (VPNs) overlaid on a communication network, such as a Local Area Network (LAN), Wide Area Network (WAN), and/or the Internet. The first, third and fourth nodes 1402, 1404, 1405 may not be in communicating relationship with each other. Indeed, the first and second modeling environments 1406, 1414 and the test development environment 1418 may not even be aware of each other. In another embodiment, the first, third and fourth nodes 1402, 1404, 1405 may be in communicating relationship with each other.

Suppose a proposed change to the design model's interface is made through the first modeling environment 1406 at the first node 1402. This proposed change may be captured by the local broker agent, and transmitted to the broker 1410 at the second node 1403. The broker 1410 may determine that the test model 1416 and the test model 1420 have registered as listeners to changes to the interface definition 1412. Accordingly, the broker 1410 may generate and transmit one or more notification messages to the third and fourth nodes 1404, 1405. The local broker agents at the third and fourth nodes 1404, 1405 may receive these notification messages, and may call respective functions on the test model 1416 and the test model 1420 so that they remain consistent with the design model 1408 as changed.

The local broker agents may be adapted to ensure that the changes take place at all of the design model 1408, the test model 1416, and the test model 1420, or that none of them are changed. Suitable techniques for enforcing such updates include database protocols, such as the Two Phase Commit protocol.

In an embodiment, the interface definition 1412 may refer to a standard, such as the standard defining the Bluetooth wireless data exchange protocol. Accordingly, tests may be defined that demonstrate compliance with the Bluetooth protocol.

In an embodiment, multiple users may create tests for the same design model simultaneously or sequentially. The users may be working in different locations. Nonetheless, the creation and revision of test models does not disturb, e.g., modify or change, the design model.

Software in the Loop (SiL)/Processor in the Loop (PIL)

As noted, the design model 300 and the test model 600 may be executed on a workstation, such as a desktop or laptop PC. In another embodiment, the design model 300 may be executed in a Software in the Loop (SiL) mode or Processor in the Loop (PIL) mode. More specifically, the code generator 240 may be operated to generate code for the design model 300. In addition, and the generated code may be compiled by the target language compiler 242. The compiled code may be loaded and executed on a target hardware device, such as a digital signal processor (DSP), a microprocessor, etc. Furthermore, the target device may be coupled to the workstation through a communication channel, such as an Ethernet port, a serial or parallel port, a USB port, a wireless connection, etc. The test model may be executed on the workstation, for example by the simulation engine 206, while the code generated from the design model 300 may be executed by the target device. Using the communication channel, the test model 600 may drive the external inputs of the design model 300, as executed by the target device, and receive the external outputs for logging and/or criteria testing.

For example, C code may be automatically generated for the design model 300 that can be executed in real-time. For example, the C code may be compiled into one or more shared libraries such as one or more dynamic link libraries (DLLs). The one or more DLLs may be executed on a microprocessor running a real-time operating system, such as the Windows CE (also known as Windows Embedded Compact) operating system.

In another embodiment, the code generator 240 may be operated to generate code complying with a Hardware Description Language (HDL). The generated HDL code may be used to configure a programmable hardware device, such as a Field Programmable Gate Array (FPGA). For example, one or more synthesis tools may receive the HDL and configure an FPGA for hardware accelerated simulation or reconfigurable input/output signal conditioning. The FPGA may be coupled to the workstation through a communication channel. In this embodiment, the test model 600 may be executed on the workstation, while the design model 300 may be executed by the FPGA.

In a further embodiment, HDL code may also be generated for some or all of the components of the test model 600, and used to further configure the FPGA to execute some or all of the test model in addition to the design model 300. In a first embodiment, HDL may be generated for the non-source and non-sink blocks of the test model 600, and used to configure the programmable logic to implement the non-source and non-sink blocks. In another embodiment, HDL may be generated for the source and/or sink blocks as well. For example, information to construct input signals may be stored in one or more look-up tables implemented on the FPGA, depending on its size. Suitable devices for performing hardware in the loop testing include the CompactRIO series of devices from National Instruments, Inc.

In an embodiment, the test models constructed for the design model 300 in the modeling environment 200 may be re-used when the design model 300 is implemented in target hardware, such as on a microprocessor or an FPGA. Suitable tools for re-using the test models include the Embedded Targets provided by Embedded Coder from The MathWorks, Inc.

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to the flow diagrams, the order of the acts may be modified in other implementations. Further, non-dependent acts may be performed in parallel. Also, the term "user", as used herein, is intended to be broadly interpreted to include, for example, a computer or data processing system (e.g., system 100) or a user of a computer or data processing system, unless otherwise stated.

Further, certain embodiments of the invention may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 100. The computer-executable instructions may include instructions that implement one or more embodiments of the invention. The tangible non-transitory computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A method comprising:
storing, in a memory, an executable design model, the design model including an external interface, the external interface of the design model including:
first graphical objects for receiving input data into the design model, during execution of the design model; and
second graphical objects providing output data computed by the design model, during the execution of the design model, wherein the design model, during the execution, implements first functionality that simulates operation of a system;
associating an executable test model with the design model;
executing the test model, wherein the executing the test model includes:
providing input test data to the first graphical objects of the design model; and
receiving output test data from the second graphical objects of the design model, and further wherein the test model, during the executing the test model, implements second functionality including testing at least part of the design model, and the second functionality implemented by the test model differs from the first functionality implemented by the design model;
constructing, by a processor, an interface specification, the interface specification identifying a mapping between external outputs of the test model and the first graphical objects of the design model or between external inputs of the test model and the second graphical objects of the design model;
detecting, by the processor, a modification to the external interface of the design model, the modification to the external interface of the design model including one or more of:

removing at least one of the first graphical objects or at least one of the second graphical objects; or adding at least one new first graphical object to the design model or at least one new second graphical object to the design mode; and automatically modifying, by the processor, the test model to conform to the modification to the external interface of the design model, maintaining consistency among the test model and the design model, the automatically modifying including either:

based on the mapping in the interface specification, removing from the test model (i) one or more of the external outputs of the test model determined to map to the at least one of the first graphical objects of (ii) one or more of the external inputs of the test model determined to map to the at least one of the second graphical objects, or (i) adding anew external output to the test model for interfacing with the at least one new first graphical object of the design model, or (ii) adding a new external input to the test model for interfacing with the at least one new second graphical object of the design model.

2. The method of claim 1 wherein the modification to the external interface of the design model and the automatically modifying the test model are performed atomically.

3. The method of claim 1 further comprising:
updating the interface specification based on the modification to the external interface of the design model and the automatically modifying the test model.

4. The method of claim 3 wherein the modification to the external interface of the design model, the automatically modifying the test model, and the updating the interface specification are performed atomically.

5. The method of claim 1 wherein the test model includes a plurality of test components, the method further comprising:
identifying one or more of the plurality of test components of the test model affected by the modification to the external interface of the design model, wherein the automatically modifying includes modifying the one or more of the plurality of test components.

6. The method of claim 1 wherein the external interface of the design model further includes at least one of:
an initialization state,
a parameter of an object of the design model, and
a control signal that controls execution of a portion of the design model.

7. The method of claim 1 wherein
the modification to the external interface of the design model includes adding a new first graphical object to the design model, and
the automatically modifying the test model includes adding a new test component adapted to communicate with the new first graphical object of the design model.

8. The method of claim 7 wherein the automatically modifying further includes configuring the new test component to provide a predefined value to the new first graphical object of the design model.

9. The method of claim 1 wherein
the modification to the external interface of the design model includes adding a new first graphical object to the design model, and
the automatically modifying the test model includes altering an existing test component to communicate with the new first graphical object of the design model.

10. The method of claim 1 wherein
the design model is specified graphically or a combination of graphically and textually, and
the test model is specified graphically, textually or a combination of graphically and textually.

11. An apparatus comprising:
a memory;
a display; and
processing logic coupled to the memory and the display wherein the processing logic is programmed to:
store, in the memory, an executable design model, the design model including an external interface, the external interface of the design model including:
first graphical objects for receiving input data into the design model, during execution of the design model; and
second graphical objects for providing output data computed by the design model, during the execution of the design model, wherein the design model, during the execution, implements first functionality that simulates operation of a system;
assign an executable test model to the design model, the test model having a test model interface;
execute the test model, wherein the executing the test model includes:
providing input test data to the first graphical objects of the design model; and
receiving output test data from the second graphical objects of the design model, and further wherein the test model, during the executing the test model, implements second functionality including testing at least part of the design model, and the second functionality implemented by the test model differs from the first functionality implemented by the design model;
present the test model on the display;
construct an interface specification, the interface specification identifying a mapping between the test model interface and the first graphical object of the design model or between the test model interface and the second graphical objects of the design model;
detect a modification to
the test model interface, or
the external interface of the design model;
if the modification is to the test model interface, automatically modify the external interface of the design model to conform to the modification to the test model interface, based on the mapping in the interface specification; and
if the modification is to the external interface of the design model, automatically modify the test model interface to conform to the modification to the external interface of the design model, based on the mapping in the interface specification,
maintaining consistency among the test model interface and the external interface of the design model.

12. The apparatus of claim 11 wherein the processing logic is further programmed to:
store the design model and the test model as separate objects.

13. The apparatus of claim 12 wherein the separate objects are stored in a single container.

14. The apparatus of claim 13 wherein
the separate objects are files, and
the single container is selected from the group consisting of:
a folder,
a director,
a project, and
a compression-type file.

15. The apparatus of claim 11 wherein the processing logic is further programmed to utilize the test model to test the design model during the execution of the design model.

16. The apparatus of claim 11 wherein the processing logic is further programmed to:
generate code for the design model; and
compile the generated code for the design model for execution by a target hardware device, wherein
the target hardware device executes the compiled, generated code, and
the test model interfaces to the target hardware device executing the compiled, generated code.

17. The apparatus of claim 16 wherein the generated code complies with a programming language selected from the group consisting of:
Ada,
Basic,
C,
C++,
C#,
SystemC,
FORTRAN,
VHDL,
Verilog, and
MATLAB.

18. The apparatus of claim 16 wherein the processing logic is further programmed to:
generate further code for at least a portion of the test model, and
compile the generated further code for the at least a portion of the test model for execution by the target hardware device, wherein
the target hardware devices executes the compiled, generated further code.

19. A non-transitory computer-readable medium comprising program instructions, the program instructions when executed by a processing element operable to:
store, in a memory, an executable design model, the design model including an external interface, the external interface of the design model including:
first graphical objects for receiving input data into the design model, during execution of the design model; and
second graphical objects for providing output data computed by the design model, during the execution of the design model, wherein the design model, during the execution, implements first functionality that simulates operation of a system;
assign an executable test model to the design model, the test model having a test model interface;
execute the test model, wherein the executing the test model includes:
providing input test data to the first graphical objects of the design model; and
receiving output test data from the second graphical objects of the design model, and further wherein the test model, during the executing the test model, implements second functionality including testing at least part of the design model, and the second functionality implemented by the test model differs from the first functionality implemented by the design model;
construct an interface specification that
stores the external interface of the design model, and
provides a mapping between the first graphical objects of the design model and the test model interface and the second graphical objects of the design model and the test model interface;
detect a modification to the interface specification; and
automatically update the external interface of the design model and test model interface in response to the modification to conform to the modification to the interface specification, maintaining consistency among the test model and the design model.

20. The non-transitory computer-readable medium of claim 19 wherein the automatically update the external interface of the design model and the test model interface is implemented through a model-view-controller architecture.

21. The non-transitory computer-readable medium of claim 19 further comprising program instructions to modify the interface specification.

22. The non-transitory computer-readable medium of claim 21 wherein the automatically update the external interface of the design model and the test model interface and the modification to the interface specification are performed atomically.

23. The non-transitory computer-readable medium of claim 21 wherein the design model, the test model, and the interface specification are separate objects.

24. The non-transitory computer-readable medium of claim 19 wherein the test model performs static analysis, model coverage, or code coverage.

25. The non-transitory computer-readable medium of claim 19 wherein the test model tests numerical outputs or execution time.

26. The non-transitory computer-readable medium of claim 19 wherein the test model is independent from the design model.

27. A method comprising:
storing, in a memory, an executable design model including an external interface, the external interface of the design model including:
first graphical objects for receiving input data into the design model, during execution of the design model; and
second graphical objects for providing output data computed by the design model, during the execution of the design model,
the design model pointing to a given interface as the external interface for the design model, wherein the design model, during the execution, implements first functionality that simulates operation of a system;
associating, with the design model, an executable test model having an interface, the test model pointing to the given interface as the interface for the test model;
executing the test model, wherein the executing the test model includes:
providing input test data to the first graphical objects of the design model; and
receiving output test data from the second graphical objects of the design model, and further wherein the test model, during the executing the test model, implements second functionality including testing at least part of the design model, and the second functionality implemented by the test model differs from the first functionality implemented by the design model;
constructing, by a processor, an interface specification, the interface specification identifying a mapping between the interface of the test model and the first graphical objects of the design model and between the interface of the test model and the second graphical objects of the design model;

in response to detecting, by the processor, a modification to the external interface of the design model or the interface of the test model, modifying, by the processor, the given interface, based on the mapping in the interface specification, maintaining consistency among the interface of the test model and the external interface of the design model; and storing the given interface, the design model, and the test model in a single storage container.

28. A method comprising:

storing, in a memory, an executable design model, the design model including an external interface, the external interface of the design model including:

first graphical objects for receiving input data into the design model, during execution of the design model; and second graphical objects for providing output data computed by the design model, during the execution of the design model, wherein the design model, during the execution, implements first functionality that simulates operation of a system;

storing a definition of the external interface independently from the design model;

associating, by a processor coupled to the memory, an executable test model with the design model, the test model including the same, independently stored external interface as the design model to maintain consistency;

executing the test model, the test model communicating with the design model during the executing the test model, wherein the communicating includes:

providing input test data to the first graphical objects of the design model; and receiving output test data from the second graphical objects of the design model, and further wherein the test model, during the executing the test model, implements second functionality including testing at least part of the design model, and the second functionality implemented by the test model differs from the first functionality implemented by the design model; and storing the external interface, the design model, and the test model in a single storage container.

29. A method comprising:

creating a single interface;

assigning, by a processor, the single interface as an external interface to an executable design model, the external interface to the design model including:

first graphical objects for receiving input data into the design model, during execution of the design model; and second graphical objects for providing output data computed by the design model, during the execution of the design model, wherein the design model, during the execution, implements first functionality that simulates operation of a system;

assigning, by the processor, the single interface as an interface to an executable test model associated with the design model to maintain consistency;

executing the test model, the test model communicating with the design model during the executing the test model, wherein the communicating includes:

providing input test data to the first graphical objects of the design model; and receiving output test data from the second graphical objects of the design model, and further wherein the test model, during the executing the test model, implements second functionality including testing at least part of the design model, and the second functionality implemented by the test model differs from the first functionality implemented by the design model; and storing in a memory coupled to the processor, the single interface, the design model, and the test model in a single storage container.

30. The method of claim 1 wherein the test model includes the design model.

31. The apparatus of claim 11 wherein the test model includes the design model.

32. The non-transitory computer-readable medium of claim 19 wherein the test model includes the design model.

* * * * *

UNITED STATES PATENT AND TRADEMARK OFFICE
CERTIFICATE OF CORRECTION

PATENT NO. : 10,372,841 B2  
APPLICATION NO. : 13/662529  
DATED : August 6, 2019  
INVENTOR(S) : Robert O. Aberg et al.

Page 1 of 2

It is certified that error appears in the above-identified patent and that said Letters Patent is hereby corrected as shown below:

In the Claims

Claim 1:  
Column 21, Line 5 reads:  
"object to the design mode; and"  
Should read:  
--object to the design model; and--

Claim 1:  
Column 21, Line 14 reads:  
"to the at least one of the first graphical objects of (ii)"  
Should read:  
--to the at least one of the first graphical objects or (ii)--

Claim 1:  
Column 21, Line 18 reads:  
"(i) adding anew external output to the test model for"  
Should read:  
--(i) adding a new external output to the test model for--

Claim 11:  
Column 22, Line 36 reads:  
"model interface and the second graphical object of the"  
Should read:  
--model interface and the second graphical objects of the--

Claim 14:  
Column 22, Line 65 reads:  
"a director,"

Signed and Sealed this  
Eighteenth Day of February, 2020

Andrei Iancu  
*Director of the United States Patent and Trademark Office*

Should read:
--a directory,--

Claim 19:
Column 24, Line 5 reads:
"model and test model interface in response to the"
Should read:
--model and the test model interface in response to the--